(12) United States Patent
Harada et al.

(10) Patent No.: US 10,686,155 B2
(45) Date of Patent: Jun. 16, 2020

(54) TRANSMISSION-TYPE LIGHT-EMITTING DEVICE AND TRANSMISSION-TYPE LIGHT-EMITTING SYSTEM FOR REDUCING LEAKAGE LIGHT

(71) Applicant: PIONEER CORPORATION, Bunkyo-ku, Tokyo (JP)

(72) Inventors: Chihiro Harada, Kawasaki (JP); Ayako Yoshida, Kawasaki (JP)

(73) Assignee: PIONEER CORPORATION, Bunkyo-Ku, Tokyo (JP)

( * ) Notice: Subject to any disclaimer, the term of this patent is extended or adjusted under 35 U.S.C. 154(b) by 0 days.

(21) Appl. No.: 16/082,255

(22) PCT Filed: Mar. 4, 2016

(86) PCT No.: PCT/JP2016/056834
§ 371 (c)(1),
(2) Date: Sep. 4, 2018

(87) PCT Pub. No.: WO2017/149772
PCT Pub. Date: Sep. 8, 2017

(65) Prior Publication Data
US 2019/0097160 A1   Mar. 28, 2019

(51) Int. Cl.
*H01L 51/52* (2006.01)
*H01L 27/32* (2006.01)
(Continued)

(52) U.S. Cl.
CPC .......... *H01L 51/5203* (2013.01); *B32B 15/04* (2013.01); *H01L 27/3281* (2013.01);
(Continued)

(58) Field of Classification Search
CPC ............. H01L 51/5203; H01L 27/3281; H01L 27/326; H01L 51/0096; H01L 51/5092; H01L 51/5275
See application file for complete search history.

(56) References Cited

U.S. PATENT DOCUMENTS

| 8,319,419 B2 | 11/2012 | Kodama et al. |
| 9,257,676 B2 | 2/2016 | Higashika |

(Continued)

FOREIGN PATENT DOCUMENTS

| JP | 2011-023336 A | 2/2011 |
| JP | 2012-012915 A | 1/2012 |

(Continued)

OTHER PUBLICATIONS

International Search Report for related International Application No. PCT/JP2016/056834 dated May 31, 2016; 2 pages.

*Primary Examiner* — Joseph L Williams
(74) *Attorney, Agent, or Firm* — Procopio, Cory, Hargreaves & Savitch LLP

(57) ABSTRACT

A light-emitting portion (140) is formed on a first surface ($S_1$) of a substrate (100), and includes a light-transmitting first electrode (110), a light-reflective second electrode (130), and an organic layer (120) located between the first electrode (110) and the second electrode (130). A light-transmitting region is located between a plurality of light-emitting portions (140). A cover member (200) covers the light-emitting portions (140). A low refractive index layer (400) is located on the first surface ($S_1$) side of the substrate (100), and has a refractive index $n_L$ lower than a refractive index $n_S$ of the substrate (100).

13 Claims, 15 Drawing Sheets

(51) Int. Cl.
    *H01L 51/00*     (2006.01)
    *H01L 51/50*     (2006.01)
    *B32B 15/04*     (2006.01)

(52) U.S. Cl.
    CPC ...... *H01L 51/0096* (2013.01); *H01L 51/5092* (2013.01); *H01L 51/5275* (2013.01); *H01L 27/326* (2013.01); *H01L 51/5225* (2013.01); *H01L 2251/5361* (2013.01)

(56) References Cited

U.S. PATENT DOCUMENTS

| | | |
|---|---|---|
| 9,748,525 B2 | 8/2017 | Higashika |
| 9,899,624 B2 | 2/2018 | Hakii et al. |
| 2010/0314616 A1 | 12/2010 | Kodama et al. |
| 2015/0340658 A1 | 11/2015 | Higashika |
| 2016/0233456 A1 | 8/2016 | Higashika |
| 2016/0293880 A1 | 10/2016 | Hakii et al. |
| 2017/0324066 A1 | 11/2017 | Higashika |

FOREIGN PATENT DOCUMENTS

| | | |
|---|---|---|
| WO | 2014-097387 A1 | 6/2014 |
| WO | 2014-148512 A1 | 9/2014 |
| WO | 2015-190252 A1 | 12/2015 |

TRANSMISSION-TYPE LIGHT-EMITTING DEVICE AND TRANSMISSION-TYPE LIGHT-EMITTING SYSTEM FOR REDUCING LEAKAGE LIGHT

CROSS-REFERENCE TO RELATED APPLICATIONS

This application is a U.S. National Stage entry of PCT Application No: PCT/JP2016/056834 filed Mar. 4, 2016, the contents of which are incorporated herein by reference.

TECHNICAL FIELD

The present invention relates to a light-emitting device and a light-emitting system.

BACKGROUND ART

In recent years, there has been progress in the development of light-emitting devices using an organic EL. Such a light-emitting device is used as an illumination device or a display device, and has a configuration in which an organic layer is interposed between a first electrode and a second electrode. Generally, a transparent material is used in the first electrode, and a metal material is used in the second electrode.

There is a technique disclosed in Patent Document 1 as one of the light-emitting devices using an organic EL. In the technique of Patent Document 1, the second electrode is provided only in a portion of a pixel in order to cause a display device using an organic EL to have optical transparency (see-through). In such a structure, since a region located between a plurality of second electrodes transmits light, the display device can have optical transparency. Meanwhile, in the technique disclosed in Patent Document 1, a light-transmitting insulating film is formed between the plurality of second electrodes in order to define a pixel. In Patent Document 1, an example of a material of this insulating film includes an inorganic material such as a silicon oxide, or a resin material such as an acrylic resin.

RELATED DOCUMENT

Patent Document

[Patent Document 1] Japanese Unexamined Patent Publication No. 2011-23336

SUMMARY OF THE INVENTION

Technical Problem

In a transmission-type light-emitting device in which light is desired to be extracted from only one surface (front surface), a portion of light may leak out even from an opposite surface (rear surface). In this case, an opposite side is not likely to be visually recognized from the rear surface side through the light-emitting device, or light extraction efficiency on the front surface decreases.

The problem to be solved by the present invention includes an example in which light is not likely to be leaked from an opposite surface to a light-emitting surface in a transmission-type light-emitting device.

Solution to Problem

According to the invention of claim 1, there is provided a light-emitting device including: a light-transmitting substrate; a plurality of light-emitting portions, formed on a first surface of the substrate, which include a light-transmitting first electrode, a light-reflective second electrode, and an organic layer located between the first electrode and the second electrode; a light-transmitting region located between the plurality of light-emitting portions; a cover member that covers the light-emitting portions; and a low refractive index layer, located on the first surface side of the substrate, which has a refractive index $n_L$ lower than a refractive index $n_S$ of the substrate.

According to the invention of claim 13, there is provided a light-emitting system including: a light-transmitting partition member that partitions a space from an outside; a light-transmitting substrate disposed on the partition member; a plurality of light-emitting portions, formed on a first surface of the substrate, which include a light-transmitting first electrode, a light-reflective second electrode, and an organic layer located between the first electrode and the second electrode; a light-transmitting region located between the plurality of light-emitting portions; a cover member that covers the light-emitting portions; and a low refractive index layer, located on the first surface side of the substrate, which has a refractive index $n_L$ lower than a refractive index $n_S$ of the substrate.

BRIEF DESCRIPTION OF THE DRAWINGS

The above and other objects, features and advantages will be made clearer from certain preferred embodiment described below, and the following accompanying drawings.

DESCRIPTION OF EMBODIMENTS

Figure 1:
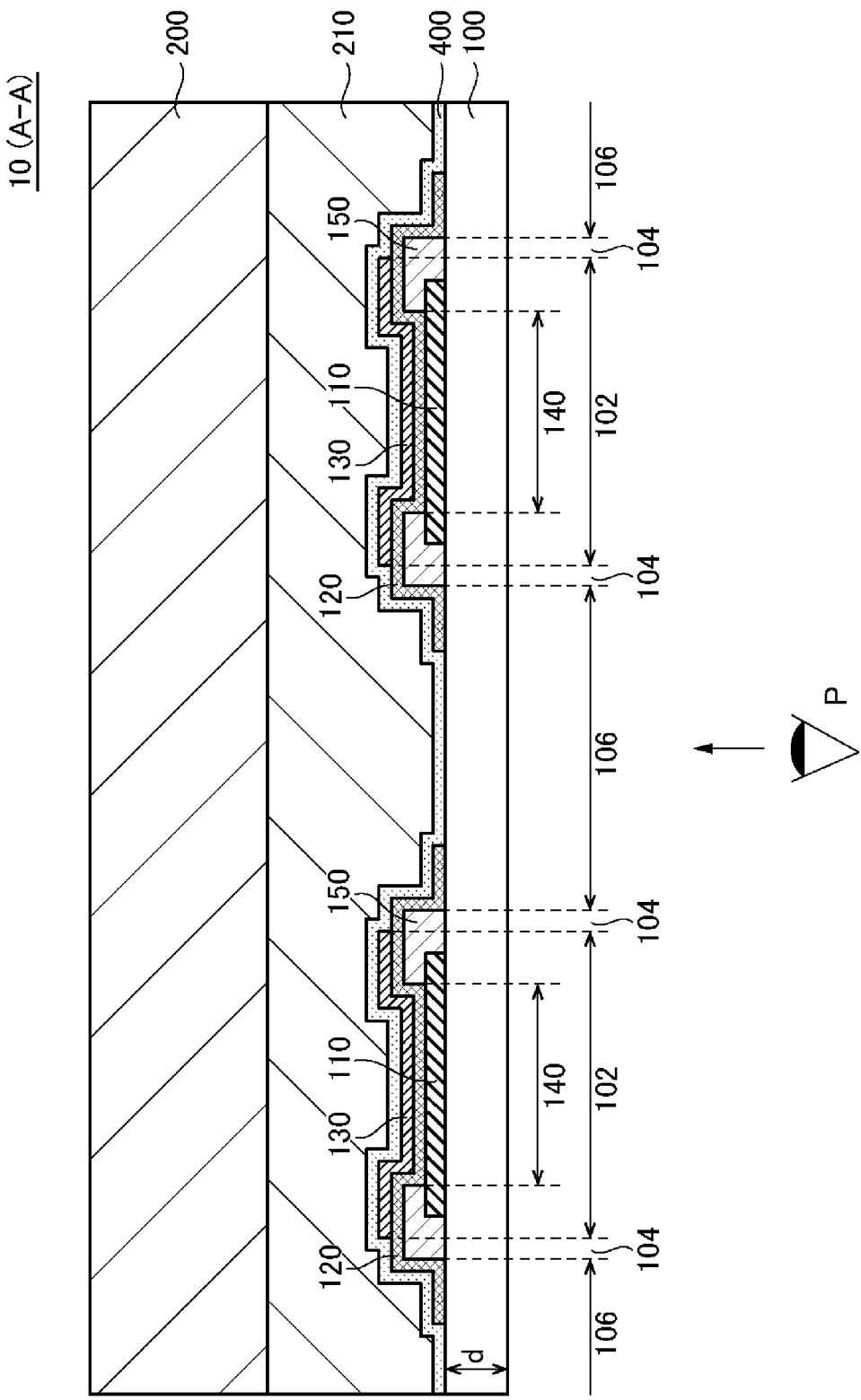
FIG. 1 is a cross-sectional view illustrating a configuration of a light-emitting device according to an embodiment.

Hereinafter, embodiments of the present invention will be described with reference to the accompanying drawings. In all the drawings, like elements are referenced by like reference numerals and the descriptions thereof will not be repeated.

FIG. 1 is a cross-sectional view illustrating a configuration of a light-emitting device 10 according to an embodiment. A person P observes a light emission surface of the light-emitting device 10 from a direction perpendicular to a substrate 100 of FIG. 1. The light-emitting device 10 according to the embodiment is an illumination device or a display device. FIG. 1 shows a case where the light-emitting device 10 is an illumination device.

The light-emitting device 10 according to the present embodiment includes a light-transmitting substrate 100, a plurality of light-emitting portions 140, a light-transmitting region, a cover member 200, and a low refractive index layer 400. The light-emitting portion 140 is formed on a first surface $S_1$ of the substrate 100, and includes a light-transmitting first electrode 110, a light-reflective second electrode 130, and an organic layer 120 located between the first electrode 110 and the second electrode 130. The light-transmitting region is located between the plurality of light-emitting portions 140. The cover member 200 covers the light-emitting portions 140. The low refractive index layer 400 is located on the first surface $S_1$ side of the substrate 100, and has a refractive index $n_L$ lower than a refractive index $n_S$ of the substrate 100. Hereinafter, a detailed description will be given.

Meanwhile, hereinafter, with reference to the light-emitting portion 140, a side on which the substrate 100 is provided is called a front surface of the light-emitting device 10, and a side on which the cover member 200 is provided is called a rear surface of the light-emitting device 10.

In the present embodiment, the light-emitting device 10 includes the substrate 100, the plurality of light-emitting portions 140, and an insulating film 150. The substrate 100 has a light-transmitting material used therein. The plurality of light-emitting portions 140 are separated from each other, and all include the first electrode 110, the organic layer 120, and the second electrode 130. The first electrode 110 is a light-transmitting electrode, and the second electrode 130 is an electrode having light shielding characteristics or light reflective characteristics. At least some of the first electrode 110 and the second electrode 130 overlap each other. However, a portion of a region having the second electrode 130 formed therein may be a light-transmitting electrode. The organic layer 120 is located between the first electrode 110 and the second electrode 130. The insulating film 150 covers the edge of the first electrode 110. In addition, at least a portion of the insulating film 150 is not covered with the second electrode 130.

When seen from a direction perpendicular to the substrate 100, the light-emitting device 10 includes a first region 102, a second region 104, and a third region 106 (light-transmitting region). The first region 102 is a region overlapping the second electrode 130. That is, the first region 102 is a region which is covered with the second electrode 130 when seen from the direction perpendicular to the substrate 100. In a case where the second electrode 130 has light shielding characteristics, the first region 102 is a region in which light is not transmitted from the front surface of the light-emitting device 10 or the substrate 100 to the rear surface thereof, and from the rear surface to the front surface. The second region 104 is a region which is not covered with the second electrode 130, but overlaps the insulating film 150. The third region 106 is a region which is neither covered with the second electrode 130, nor overlaps the insulating film 150. Since the width of the second region 104 is smaller than the width of the third region 106, the light-emitting device 10 has sufficient optical transparency. Meanwhile, a light-transmitting region may be formed by the second region 104 and the third region 106.

Figure 2:
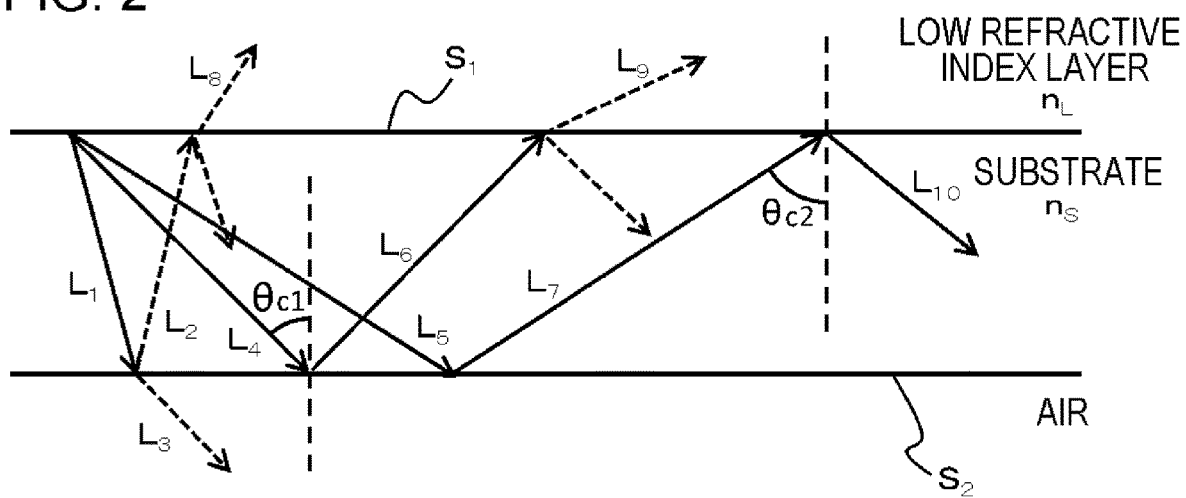
FIG. 2 is a schematic diagram illustrating states of reflection and refraction of light at an interface between a low refractive index layer and a substrate and an interface between the substrate and the air.

FIG. 2 is a schematic diagram illustrating states of reflection and refraction of light at an interface between the low refractive index layer 400 and the substrate 100, and an interface between the substrate 100 and the air. In the drawing, arrows of solid lines and broken lines show an example of an optical path of light emitted from the light-emitting portion 140. In a case where light from the substrate 100 side is incident on the interface between the substrate 100 and the air at an incidence angle smaller than a critical angle $\theta_{c1}$ ($L_1$ in the drawing), a portion of the light serves as reflected light ($L_2$ in the drawing), and another portion thereof serves as emitted light ($L_3$ in the drawing). Here, in a case where the refractive index of the substrate 100 is set to $n_S$, a relation of the critical angle $\theta_{c1}=\arcsin(1/n_S)$ is established. On the other hand, in a case where the light from the substrate 100 side is incident on the interface between the substrate 100 and the air at an incidence angle equal to or greater than the critical angle $\theta_{c1}$ ($L_4$ and $L_5$ in the drawing), all the light beams having reached a front surface $S_2$ of the substrate 100 are totally reflected ($L_6$ and $L_7$ in the drawing). A portion of reflected light ($L_2$, $L_6$) is transmitted from the rear surface (first surface) $S_1$ of the substrate 100 to the cover member 200 side ($L_8$ and $L_9$ in the drawing), and causes rear-surface leakage light.

Here, in a case where an incidence angle from the substrate 100 side is equal to or greater than a critical angle $\theta_{c2}$ at an interface between the substrate 100 and the low refractive index layer 400 ($L_7$), the light returns to the substrate 100 side due to total reflection ($L_{10}$), and thus it is possible to suppress the infiltration of the light into the cover member 200 side. That is, it can be said that the light is not likely to be transmitted from a material having a high refractive index to a material having a low refractive index. Therefore, the rear-surface leakage light is reduced. Meanwhile, in a case where the refractive index of the low refractive index layer 400 is set to $n_L$, a relation of the critical angle $\theta_{c2}=\arcsin(n_L/n_S)$ is established. In addition, in the drawing, an example has been described in which the low refractive index layer 400 is provided in contact with the substrate 100, but this also applies in a case where another layer is present between the substrate 100 and the low refractive index layer 400. Insofar as the low refractive index layer 400 is located on the rear surface side rather than the light-emitting portion 140, the low refractive index layer may be formed on any layer in the laminated structure of the light-emitting device 10.

In a case where the substrate 100 is covered with the cover member 200 or an adhesive layer 210, total reflection on the rear surface $S_1$ side of the substrate 100 is not likely to be caused as compared with a case where a rear surface 109 of the substrate 100 is exposed to the air, and the rear-surface leakage light has a tendency to occur. On the other hand, the light-emitting device 10 according to the present embodiment includes the low refractive index layer 400 having a refractive index $n_L$ lower than the refractive index $n_S$ of the substrate 100, and thus it is possible to reduce light which is emitted to the rear surface side of the light-emitting device 10 provided with the cover member 200.

Referring back to FIG. 1, each component of the light-emitting device 10 will be described. The substrate 100 is a substrate such as, for example, a glass substrate or a resin substrate which has optical transparency. The substrate 100 may have flexibility. In a case where the substrate has flexibility, the thickness d of the substrate 100 is, for example, equal to or greater than 10 μm and equal to or less than 1,000 μm. The substrate 100 is, for example, polygonal such as rectangular, or circular. In a case where the substrate 100 is a resin substrate, the substrate 100 is formed using, for example, polyethylene naphthalate (PEN), polyether sulphone (PES), polyethylene terephthalate (PET), or polyimide. The refractive index $n_S$ of the substrate 100 is not particularly limited, and is, for example, equal to or greater than 1.5. In addition, in a case where the substrate 100 is a resin substrate, it is preferable that an inorganic barrier film such as $SiN_x$, SiON or the like is formed on at least one surface (preferably both surfaces) of the substrate 100 in order to prevent moisture from permeating the substrate 100.

The light-emitting portion 140 is formed on one surface of the substrate 100. The light-emitting portion 140 has a configuration in which the first electrode 110, the organic layer 120, and the second electrode 130 are laminated in this order. In a case where the light-emitting device 10 is an illumination device, the plurality of light-emitting portions 140 extend linearly. On the other hand, in a case where the light-emitting device 10 is a display device, the plurality of light-emitting portions 140 may be disposed so as to form a matrix, or may be configured so as to form a segment or display a predetermined shape (so as to display, for example, an icon). The plurality of light-emitting portions 140 are formed for each separate pixel.

The first electrode 110 is a transparent electrode having optical transparency. A material of the transparent electrode is a material containing a metal, for example, a metal oxide such as an indium tin oxide (ITO), an indium zinc oxide (IZO), an indium tungsten zinc oxide (IWZO), a zinc oxide (ZnO) or the like. The thickness of the first electrode 110 is, for example, equal to or greater than 10 nm and equal to or less than 500 nm. The first electrode 110 is formed using, for example, a sputtering method or an evaporation method. Meanwhile, the first electrode 110 may be a conductive organic material such as a carbon nanotube or PEDOT/PSS. In the drawing, a plurality of first linear electrodes 110 are formed on the substrate 100 in parallel to each other. For this reason, the first electrode 110 is not located in the second region 104 and the third region 106. Meanwhile, since the first electrode 110 is a transparent electrode having optical transparency, the first electrode may be located in the second region 104 and the third region 106.

In addition, the first electrode 110 may be provided with an auxiliary electrode (not shown). In this case, the auxiliary electrode is formed of a material having a lower resistance value than that of the first electrode 110 in a state of being in contact with the first electrode 110. The auxiliary electrode may be located on the upper layer (organic layer 120 side) of the first electrode 110 and may be located on the lower layer (substrate 100 side) thereof. The auxiliary electrode is formed using, for example, at least one metal layer. In addition, in a case where the auxiliary electrode is located on the upper layer of the first electrode 110, the upper portion of the auxiliary electrode is covered with the insulating film 150, and the auxiliary electrode is directly connected to neither the organic layer 120 nor the second electrode 130. It is possible to lower the apparent resistance value of the first electrode 110 by providing the auxiliary electrode.

The organic layer 120 includes a light-emitting layer. The organic layer 120 has a configuration in which, for example, a hole injection layer, a light-emitting layer, and an electron injection layer are laminated in this order. A hole transport layer may be formed between the hole injection layer and the light-emitting layer. In addition, an electron transport layer may be formed between the light-emitting layer and the electron injection layer. The organic layer 120 may be formed using an evaporation method. In addition, at least one layer of the organic layer 120, for example, a layer which is in contact with the first electrode 110 may be formed using an application method such as an ink jet method, a printing method, or a spraying method. Meanwhile, in this case, the remaining layers of the organic layer 120 are formed using an evaporation method. In addition, all the layers of the organic layer 120 may be formed using an application method.

The second electrode 130 includes a metal layer constituted of, for example, a metal selected from a first group consisting of Al, Au, Ag, Pt, Mg, Sn, Zn, and In, or an alloy of metals selected from this first group. In this case, the second electrode 130 has light shielding characteristics. The thickness of the second electrode 130 is, for example, equal to or greater than 10 nm and equal to or less than 500 nm. However, the second electrode 130 may be formed using a material exemplified as the material of the first electrode 110. The second electrode 130 is formed using, for example, a sputtering method or an evaporation method. In the example shown in the drawing, the light-emitting device 10 includes a plurality of second linear electrodes 130. The second electrode 130 is provided over each of the first electrodes 110, and is larger in width than the first electrode 110. For this reason, the entirety of the first electrode 110 is overlapped and covered with the second electrode 130 in a width direction when seen from the direction perpendicular to the substrate 100. In addition, the first electrode 110 may be larger in width than the second electrode 130, and the entirety of the second electrode 130 may be covered with the first electrode 110 in a width direction when seen from the direction perpendicular to the substrate 100.

In the example of the drawing, the first electrode 110 and the organic layer 120 are provided for each light-emitting portion 140, but at least one of the first electrode 110 and the organic layer 120 may be continuously provided across two or more light-emitting portions 140 next to each other. That is, at least one of the first electrode 110 and the organic layer 120 may be provided across the first region 102, the second region 104, and the third region 106.

In the present embodiment, the edge of the first electrode 110 is covered with the insulating film 150. The insulating film 150 is formed of, for example, a photosensitive resin material such as polyimide, and surrounds a portion of the first electrode 110 which serves as the light-emitting portion 140. The edge of the second electrode 130 in a width direction is located over the insulating film 150. In other words, when seen from the direction perpendicular to the substrate 100, a portion of the insulating film 150 protrudes from the second electrode 130. In addition, in the example shown in the drawing, the organic layer 120 is also formed on the upper portion and lateral side of the insulating film 150. However, the organic layer 120 is partitioned between the light-emitting portions 140 next to each other. In addition, in a case where the organic layer 120 has optical transparency, the organic layer may not be partitioned between the light-emitting portions 140 next to each other.

As described above, the light-emitting device 10 includes the first region 102, the second region 104, and the third region 106. The first region 102 is a region overlapping the second electrode 130. The second region 104 is a region which is not covered with the second electrode 130, but overlaps the insulating film 150. In the example shown in the drawing, the organic layer 120 is also formed in the second region 104. The third region 106 is a region which is not covered with the second electrode 130, and does not overlap the insulating film 150. In the example shown in the drawing, the organic layer 120 is not formed in at least a portion of the third region 106. The width of the second region 104 is smaller than the width of the third region 106. In addition, the width of the third region 106 may be larger or smaller than the width of the first region 102. In a case where the width of the first region 102 is set to 1, the width of the second region 104 is, for example, equal to or greater than 0 (or greater than 0) and equal to or less than 0.2, and the width of the third region 106 is, for example, equal to or greater than 0.3 and equal to or less than 2. In addition, the width of the first region 102 is, for example, equal to or greater than 50 μm and equal to or less than 500 μm, the width of the second region 104 is, for example, equal to or greater than 0 μm (or greater than 0 μm) and equal to or less than 100 μm, and the width of the third region 106 is, for example, equal to or greater than 15 μm and equal to or less than 1,000 μm.

The low refractive index layer 400 is provided so as to cover at least a light-transmitting region when seen from a direction perpendicular to the surface of the substrate 100. For example, the low refractive index layer 400 is provided in a region between two light-emitting portions 140 next to each other, and is provided in the second region 104 and the third region 106. In the example of the drawing, the low refractive index layer 400 is provided so as to cover the whole of the substrate 100 except the edge (end) of the substrate when seen from the direction perpendicular to the surface of the substrate 100. For example, a terminal or the like may be provided on the edge of the substrate 100. It can also be said that the low refractive index layer 400 is provided so as to continuously cover two light-emitting portions 140 next to each other and a region therebetween. The low refractive index layer 400 is provided so as to cover the whole of the substrate 100 except the edge of the substrate, and thus it is possible to protect the light-emitting portion 140 from the outside air or sealing damage. In addition, in the present embodiment, the low refractive index layer 400 is located between the light-emitting portion 140 and the cover member 200. That is, the low refractive index layer 400 is provided separately from the cover member 200. In addition, in the example of the drawing, the surface of the low refractive index layer 400 on the substrate 100 side is in contact with the second electrode 130, and the surface of the low refractive index layer 400 on the cover member 200 side is in contact with the adhesive layer 210.

The low refractive index layer 400 is a film that covers the upper portion of the substrate 100, and has optical transparency. The material of the low refractive index layer 400 is not particularly limited, and an example thereof includes an inorganic film such as $SiO_x$ or $MgF_2$, a resin containing fine particles of $SiO_x$, $MgF_2$ or the like, a fluorinated resin, and the like. A base material in the resin material is not particularly limited, and can have acryl, epoxy or the like used thereas. A method of forming the low refractive index layer 400 is not particularly limited, and an example thereof includes a vacuum film formation method such as an evaporation method or a sputtering method, and an application method such as a die coating method or an ink jet method. In addition, the thickness of the low refractive index layer 400 is, for example, equal to or greater than 10 nm and equal to or less than 100 μm. Since the low refractive index layer 400 is transparent, it is possible to maintain the optical transparency of the light-emitting device 10. The refractive index $n_L$ of the low refractive index layer 400 is not particularly limited insofar as being lower than the refractive index $n_S$ of the substrate 100, and is, for example, equal to or greater than 1 and equal to or less than 1.5.

The cover member 200 covers the light-emitting portion 140 and the insulating film 150, and is fixed to the light-emitting portion 140 directly or through the adhesive layer 210. The cover member 200 has, for example, a function as a sealing member. One surface of the cover member 200 is exposed to the rear surface side of the light-emitting device 10. In addition, the cover member 200 and the adhesive layer 210 have optical transparency. In the drawing, an example is shown in which the cover member 200 is fixed to the light-emitting portion 140 through the adhesive layer 210. As the cover member 200, for example, a resin film, glass or the like can be used. In the example of the drawing, the surface of the adhesive layer 210 which faces the substrate 100 is in contact with the low refractive index layer 400, and the surface of the adhesive layer 210 on the opposite side to the substrate 100 is in contact with the cover member 200.

In addition, the edge of the cover member 200 may be fixed to the substrate 100 using an adhesive material, and a material having a drying function may be filled between the cover member 200 and the substrate 100.

Meanwhile, the cover member 200 may be further provided with a barrier layer or the like. In that case, a combination of the cover member 200 and the barrier layer can be regarded as a cover member.

On the other hand, sealing may be performed by forming a film having a high moisture barrier property directly on the light-emitting portion 140. As a sealing film, for example, inorganic barrier films such as $SiN_x$, SiON, $Al_2O_3$, or $TiO_2$, a barrier laminated film including these films, or a film containing these materials mixed can be used. These films can be formed using, for example, a vacuum film formation method such as a sputtering method, a CVD method, or an ALD method. In addition, a resin film is provided on the upper layer of the sealing film, and thus it is possible to prevent the barrier property from being damaged due to damage to an inorganic sealing film. In such a case, the inorganic barrier film, the barrier laminated film, and the resin film are combined with each other and formed into the cover member 200. The low refractive index layer 400 is located between the light-emitting portion 140 and the cover member 200. The cover member 200 is in contact with the low refractive index layer 400. In this case, the thickness of the cover member 200 is particularly limited, and is, for example, equal to or greater than 10 nm and equal to or less than 1 mm.

Figure 3:
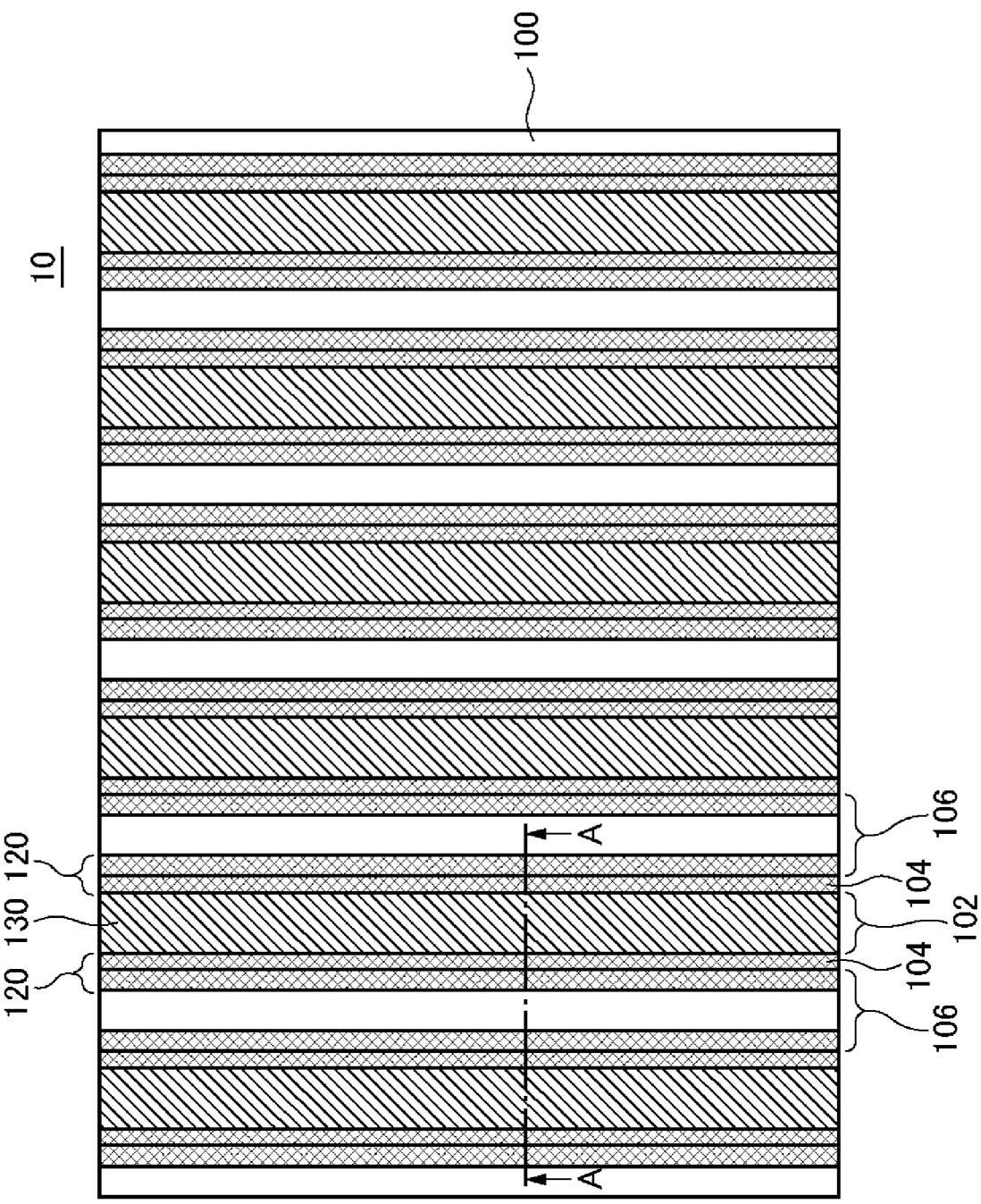
FIG. 3 is a plan view of the light-emitting device according to the embodiment.

FIG. 3 is a plan view of the light-emitting device 10 according to the present embodiment. Meanwhile, in the drawing, the adhesive layer 210, the cover member 200 and the low refractive index layer 400 are omitted, and FIG. 1 corresponds to a cross-section A-A of FIG. 3. In the example shown in the drawing, the plurality of light-emitting portions 140 are separated from each other, and each extend in the same direction when seen from a direction perpendicular to the substrate 100. In addition, the first region 102, the second region 104, and the third region 106 all extend linearly and in the same direction. As shown in FIGS. 1 and 3, the second region 104, the first region 102, the second region 104, and the third region 106 are repeatedly lined up in this order.

Next, a method of manufacturing the light-emitting device 10 will be described. First, the first electrode 110 is formed over the substrate 100 using, for example, a sputtering method. Next, the first electrode 110 is formed in a predetermined pattern using, for example, a photolithography method. Next, the insulating film 150 is formed over the edge of the first electrode 110. For example, in a case where the insulating film 150 is formed of a photosensitive resin, the insulating film 150 is formed in a predetermined pattern by undergoing exposure and development steps. Next, the organic layer 120 and the second electrode 130 are formed in this order. In a case where the organic layer 120 includes a layer which is formed using an evaporation method, this layer is formed in a predetermined pattern using, for example, a mask or the like. The second electrode 130 is also formed in a predetermined pattern using, for example, a mask or the like. Thereafter, the low refractive index layer 400 is formed using, for example, a vacuum vapor deposition method, and the light-emitting portion 140 is further sealed using the cover member 200.

As described above, the light-emitting device 10 includes the low refractive index layer 400 having a refractive index $n_L$ lower than the refractive index $n_S$ of the substrate 100. Hereinafter, the low refractive index layer 400 will be further described.

Figure 4:
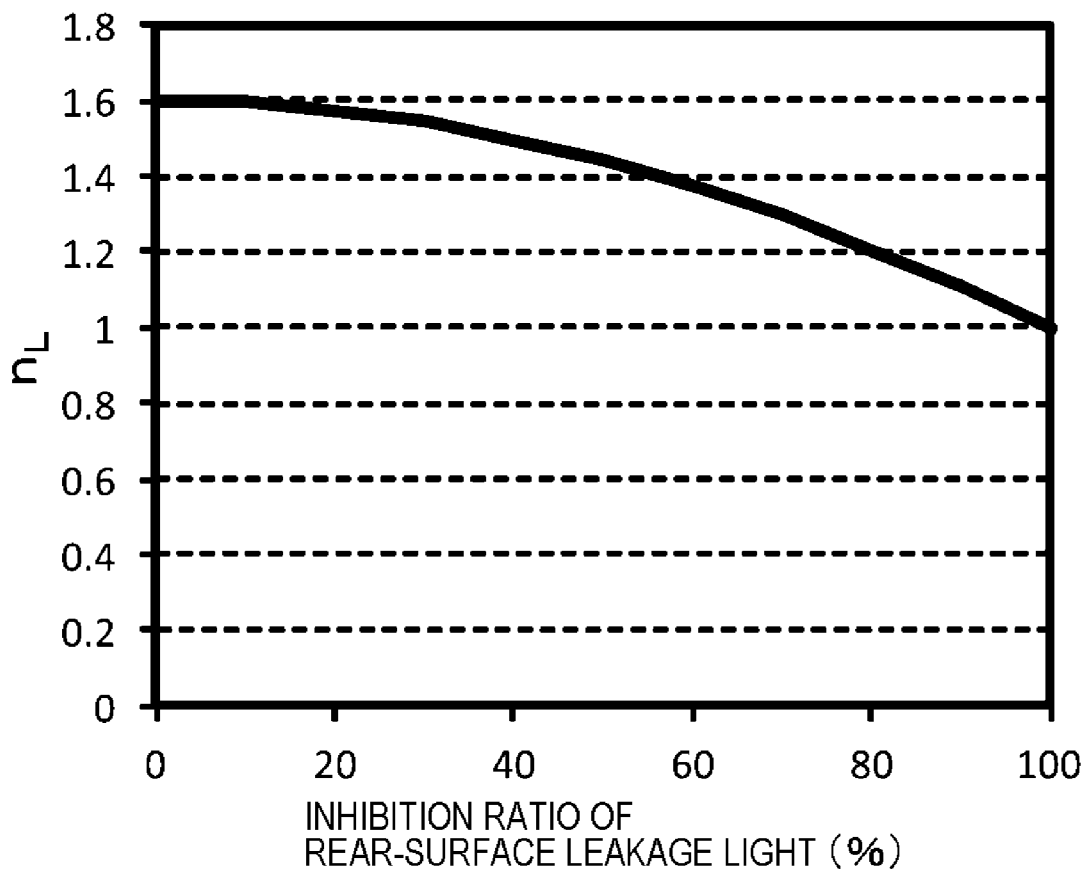
FIG. 4 is a diagram illustrating a relationship between the refractive index $n_L$ of the low refractive index layer and the inhibition ratio of rear-surface leakage light.

FIG. 4 is a diagram illustrating a relationship between the refractive index $n_L$ of the low refractive index layer 400 and the inhibition ratio of rear-surface leakage light. The vertical axis in the drawing is the refractive index $n_L$ of the low refractive index layer 400, and the horizontal axis is the inhibition ratio (%) of the rear-surface leakage light. Here, the inhibition ratio of the rear-surface leakage light is a ratio of light capable of being totally reflected at the interface between the substrate 100 and the low refractive index layer 400 with respect to light totally reflected at the interface between the substrate 100 and the air, and can be calculated as follows.

Light having an incidence angle θ [rad] in a range of $\theta_{c1} \leq \theta < \pi/2$ among beams of light incident on the interface between the substrate 100 and the air from the substrate 100 side is totally reflected. Light having an incidence angle θ [rad] in a range of $\theta_{c2} \leq \theta < \pi/2$ is further totally reflected at the interface between the substrate 100 and the low refractive index layer 400. Meanwhile, a relation of $\theta_{c1} < \theta_{c2}$ is established. Therefore, the ratio of light totally reflected at the interface between the substrate 100 and the low refractive index layer 400 with respect to light totally reflected at the interface between substrate 100 and the air is represented by $(\pi/2 - \theta_{c2})/(\pi/2 - \theta_{c1})$ at a ratio of angles.

As described above, relations of $\theta_{c1} = \arcsin(1/n_S)$ and $\theta_{c2} = \arcsin(n_L/n_S)$ are established, and the drawing shows a relationship in a case where the refractive index $n_S$ of the substrate 100 is set to 1.6.

The refractive index $n_L$ of the low refractive index layer 400 may be lower than the refractive index $n_S$ of the substrate 100 as described above, and is not particularly limited. It is preferable that a relation of $n_L < n_S \times \sin(3\theta_{c1}/10 + 7\pi/20)$ is established, more preferable that a relation of $n_L < n_S \times \sin(\theta_{c1}/2 + \pi/4)$ is established, and more preferable a relation of $n_L < n_S \times \sin(7\theta_{c1}/10 + 3\pi/20)$ is established. As shown in the drawing, in a case where a relation of $n_L < n_S \times \sin(3\theta_{c1}/10 + 7\pi/20)$ is established, equal to or more than 30% of light totally reflected on the front surface side of the substrate 100 can be reflected by the low refractive index layer 400. In addition, in a case where a relation of $n_L < n_S \times \sin(\theta_{c1}/2 + \pi/4)$ is established, equal to or more than 50% of light totally reflected on the front surface side of the substrate 100 can be reflected by the low refractive index layer 400. In a case where a relation of $n_L < n_S \times \sin(7\theta_{c1}/10 + 3\pi/20)$ is established, equal to or more than 70% of light totally reflected on the front surface side of the substrate 100 can be reflected by the low refractive index layer 400.

Hereinbefore, according to the present embodiment, the light-emitting device 10 includes the low refractive index layer 400 having a refractive index $n_L$ lower than the refractive index $n_S$ of the substrate 100. Therefore, light reflected on the front surface side of the substrate 100 is prevented from being emitted to the rear surface side of the light-emitting device 10, and thus it is possible to reduce the rear-surface leakage light.

Meanwhile, the substrate 100 may be constituted by a plurality of layers. For example, a barrier layer may be formed on the substrate.

An example of the barrier layer includes a laminated structure of an inorganic barrier layer and a resin layer. In addition, an optical film such as an antireflection film may be provided on at least one surface of the substrate 100. In this case, a plurality of layers such as the barrier layer or the optical film can be inclusively defined as the substrate 100. In this manner, even in a case where the substrate 100 is constituted by a plurality of layers, light having an angle θ with a relation of $\theta > \arcsin(1/n_S)$ in a layer of a refractive index $n_S$ is totally reflect at an air interface with no change. Meanwhile, here, e indicates an incidence angle of light at an interface between the layer and another layer (front surface side). In addition, the above-described logic is similarly established with respect to any layer. Therefore, the refractive index of any layer may be used as the refractive index $n_S$. The refractive index of a thickest layer may be used, the refractive index of an outermost layer may be used, and a highest refractive index may be set to $n_S$. That is, the refractive index of at least one layer may be lower than the refractive index $n_S$ of the substrate 100. With the refractive index of at least one layer set to $n_S$, it is preferable that a relation of $n_L < n_S \times \sin(3\theta_{c1}/10 + 7\pi/20)$ is established, more preferable that a relation of $n_L < n_S \times \sin(\theta_{c1}/2 + \pi/4)$ is established, and more preferable that a relation of $n_L < n_S \times \sin(7\theta_{c1}/10 + 3\pi/20)$ is established. Above all, in a case where the above relationship is satisfied with a lowest refractive index set to $n_S$, more excellent effect is obtained.

EXAMPLE 1

Figure 5:
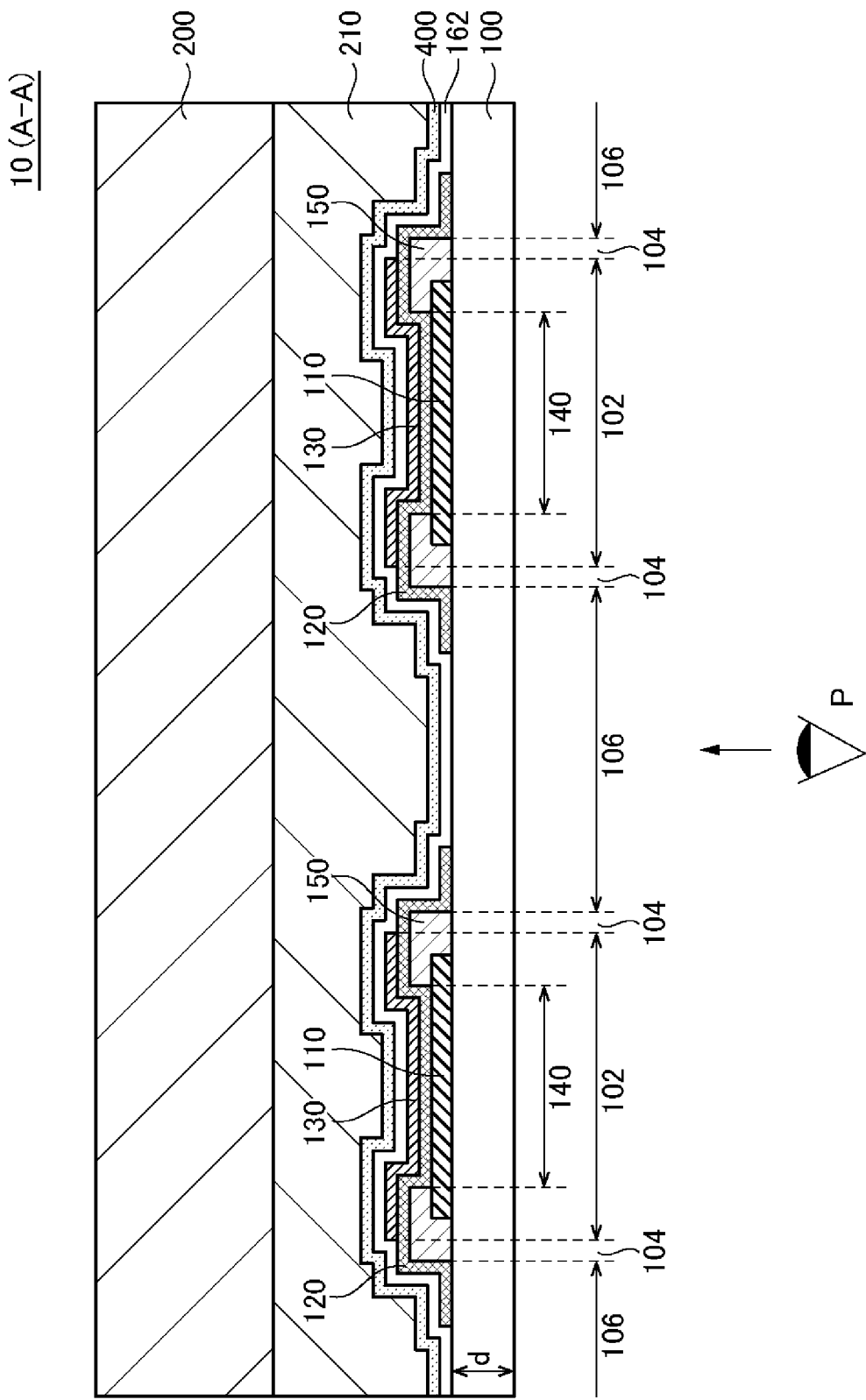
FIG. 5 is a cross-sectional view illustrating a configuration of a light-emitting device according to Example 1.

FIG. 5 is a cross-sectional view illustrating a configuration of a light-emitting device 10 according to Example 1. The drawing corresponds to FIG. 1 of the embodiment. The light-emitting device 10 according to the present example is the same as the light-emitting device 10 according to the embodiment, except that a protective layer 162 is provided between the light-emitting portion 140 and the low refractive index layer 400. Hereinafter, a detailed description will be given.

The protective layer 162 covers at least the light-emitting portion 140 when seen from a direction perpendicular to the surface of the substrate 100. In the example of the drawing, the protective layer 162 is provided so as to cover the whole of the substrate 100 except the edge of the substrate. In addition, in the example of the drawing, the surface of the protective layer 162 which faces the substrate 100 is in contact with the second electrode 130, and the surface of the protective layer 162 on the opposite side to the substrate 100 is in contact with the low refractive index layer 400. The protective layer 162 is formed of, for example, an insulating material, more specifically, an inorganic material such as an aluminum oxide or a titanium oxide. In addition, the thickness of the protective layer 162 is, for example, equal to or greater than 50 nm and equal to or less than 300 nm.

The protective layer 162 is formed using, for example, an atomic layer deposition (ALD) method. In this case, the step covering property of the protective layer 162 is better. In addition, in this case, the protective layer 162 may have a multi-layered structure in which a plurality of layers are laminated. In this case, the protective layer may have a structure in which a first sealing layer constituted of a first material (for example, aluminum oxide) and a second sealing layer constituted of a second material (for example, titanium oxide) are repeatedly laminated. A lowermost layer may be any of the first sealing layer and the second sealing layer. In addition, an uppermost layer may also be any of the first sealing layer and the second sealing layer. In addition, the protective layer 162 may be a single layer in which the first material and the second material are mixed.

However, the protective layer 162 may be formed using other film formation methods, for example, a CVD method or a sputtering method. In this case, the protective layer 162 is formed by an insulating film such as $SiO_2$ or SiN, and the film thickness is, for example, equal to or greater than 10 nm and equal to or less than 1,000 nm.

Meanwhile, layers other than the protective layer 162 may be further provided between the light-emitting portion 140 and the low refractive index layer 400, and another layer may be further provided instead of the protective layer 162. In addition, the protective layer 162 may be provided between the low refractive index layer 400 and the cover member 200, and another layer may be further provided between the low refractive index layer 400 and the cover member 200.

Hereinbefore, according to the present example, as is the case with the embodiment, light reflected on the front surface side of the substrate 100 is prevented from being emitted to the rear surface side of the light-emitting device 10, and thus it is possible to reduce the rear-surface leakage light. Further, a film having a high barrier property is formed as the protective layer 162, and thus it is possible to protect the light-emitting portion 140 from moisture or gas, and damage due to a process of forming the low refractive index layer 400, the cover member 200 or the like. Furthermore, it is possible to increase the degree of freedom of a process of manufacturing the light-emitting device 10.

EXAMPLE 2

Figure 6:
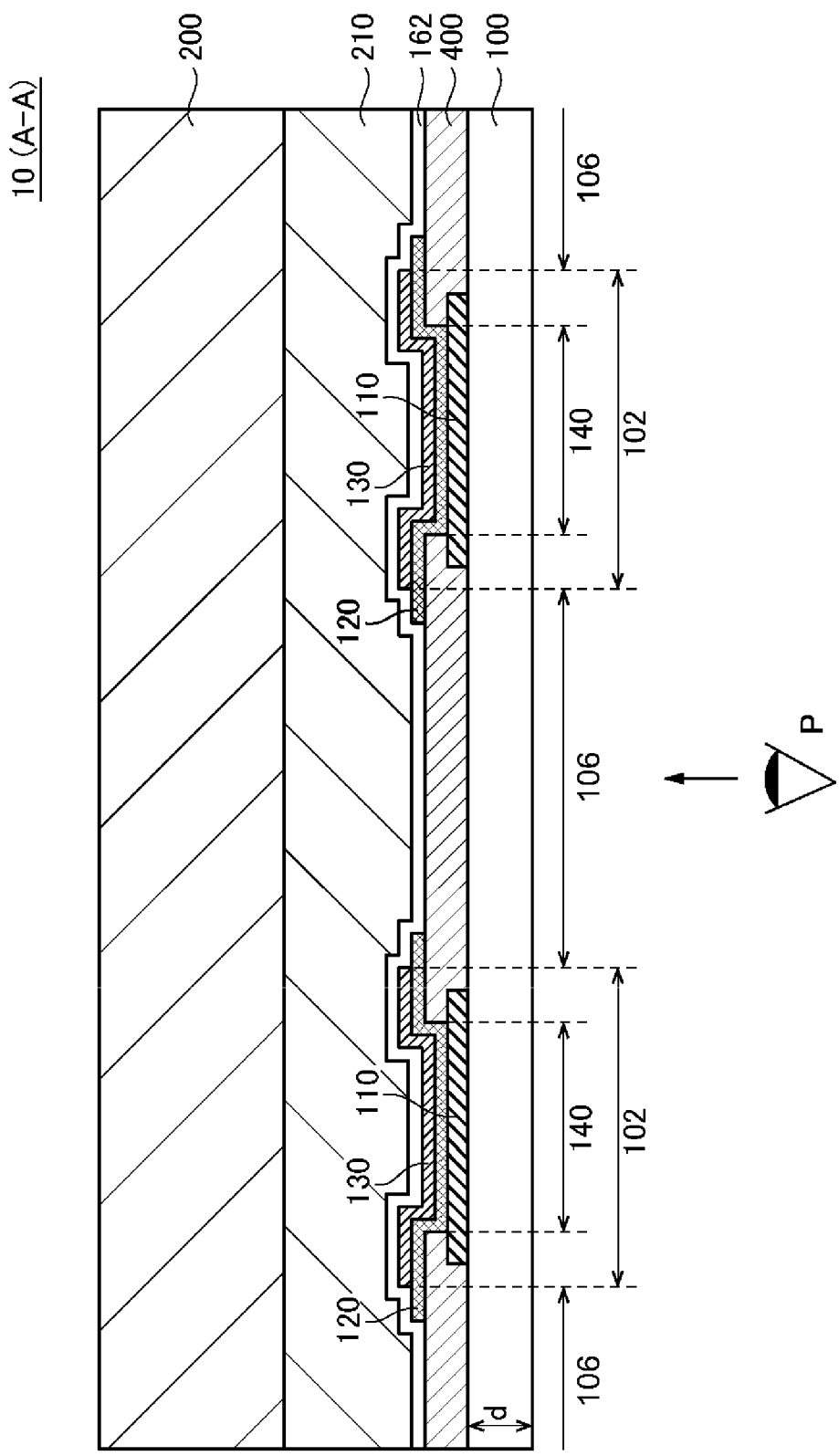
FIG. 6 is a cross-sectional view illustrating a configuration of a light-emitting device according to Example 2.

FIG. 6 is a cross-sectional view illustrating a configuration of a light-emitting device 10 according to Example 2. The drawing corresponds to FIG. 1 of the embodiment. The light-emitting device 10 according to the present example is the same as the light-emitting device 10 according to Example 1, except that the low refractive index layer 400 is provided so as to cover the edge of the first electrode 110. Hereinafter, a detailed description will be given.

The light-emitting device 10 according to the present example is configured such that the low refractive index layer 400 has a function of the insulating film 150 of the embodiment. The low refractive index layer 400 covers only a region in which the light-emitting portion 140 is not formed when seen from a direction perpendicular to the surface of the substrate 100. In addition, the low refractive index layer 400 covers the entirety of the region in which the light-emitting portion 140 is not formed when seen from the direction perpendicular to the surface of the substrate 100. The low refractive index layer 400 defines the light-emitting portion 140. In the example of the drawing, the low refractive index layer 400 is in contact with the substrate 100 and the first electrode 110 on a surface facing the substrate 100, and is in contact with the organic layer 120 on a surface on the opposite side to the substrate 100. In addition, in the drawing, an example is shown in which the protective layer 162 that covers the light-emitting portion 140 is provided, but the protective layer 162 may be omitted.

In the light-emitting device 10 according to the present example, a region between two first regions 102 next to each other is the third region 106, and the first region 102 and the third region 106 are alternately provided.

In the present example, the low refractive index layer 400 is constituted of, for example, a fluorine-based resin. Besides, as the low refractive index layer 400, a resin containing low-refractive-index particles such as $SiO_x$ or $MgF_2$ may be used. The kind of base resin is not particularly limited, and polyimide, acryl, epoxy or the like can be used as the base resin. In addition, in the present example, the thickness of the low refractive index layer 400 is, for example, equal to or greater than 100 nm and equal to or less than 5,000 nm. The low refractive index layer 400 according to the present example is formed using, for example, an application method after the first electrode 110 is formed and before the organic layer 120 is formed. For example, in a case where the low refractive index layer 400 is formed of a photosensitive resin, the low refractive index layer 400 is formed in a predetermined pattern by undergoing exposure and development steps.

Hereinbefore, according to the present example, as is the case with the embodiment, light reflected on the front surface side of the substrate 100 is prevented from being emitted to the rear surface side of the light-emitting device 10, and thus it is possible to reduce the rear-surface leakage light. In addition, according to the present example, the edge of the first electrode 110 is covered with the low refractive index layer 400. Therefore, the low refractive index layer 400 can also have a function of the insulating film 150, and thus the insulating film 150 and the low refractive index layer 400 are not required to be formed in separate steps.

In addition, in a case where the insulating film 150 as in the embodiment is provided on the substrate 100, in order to suppress peeling which is generated in an edge portion in which the insulating film 150 is bonded to the substrate 100, a film having the same material as that of the first electrode 110 may be patterned in a fine line shape and provided in a bonding portion. On the other hand, in the present example, the low refractive index layer 400 is provided on the entire surface other than a region overlapping the light-emitting portion 140, and thus is not likely to be peeled off from the substrate 100. Thus, it is not necessary to provide a pattern having that kind of fine line.

EXAMPLE 3

Figure 7:
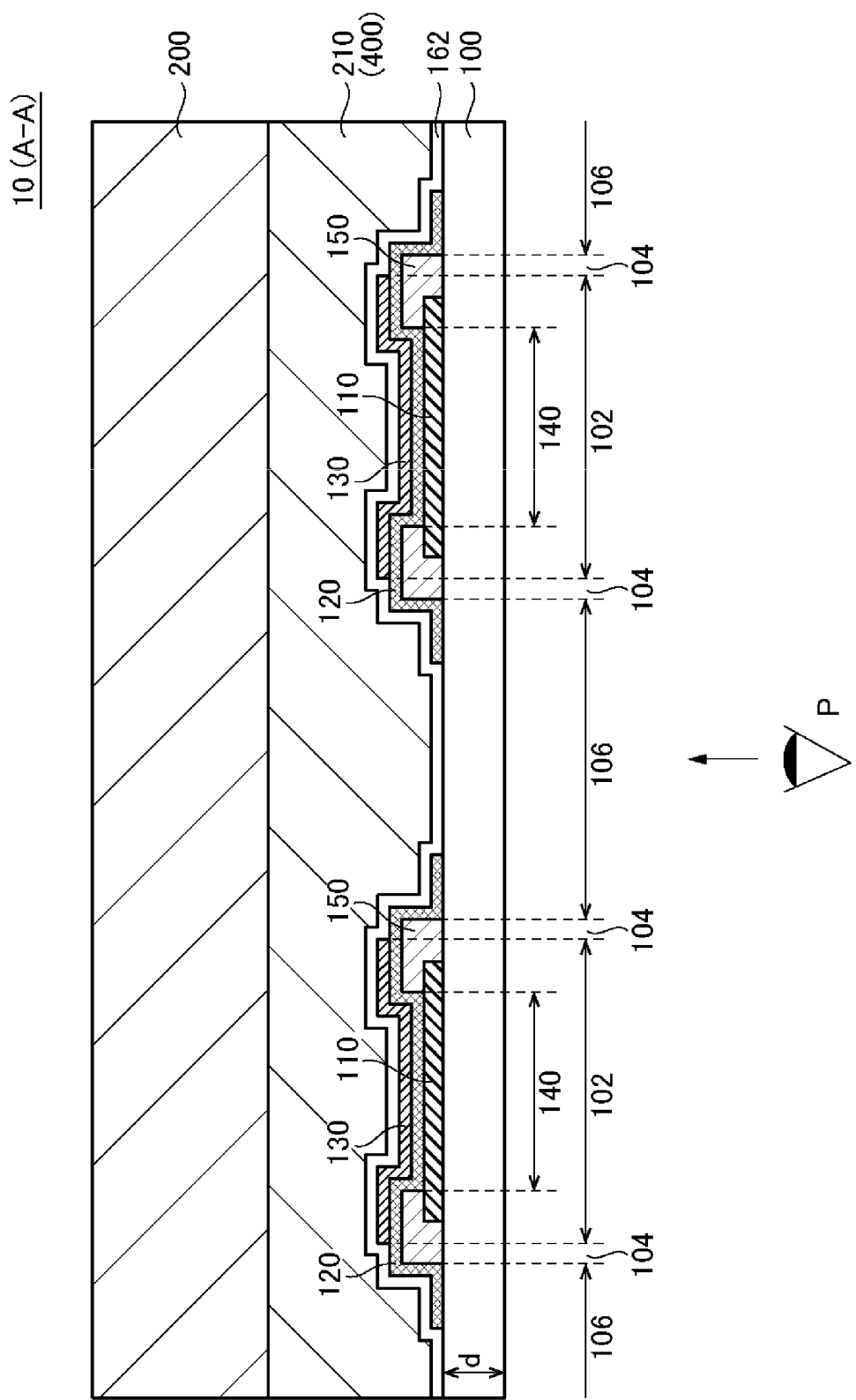
FIG. 7 is a cross-sectional view illustrating a configuration of a light-emitting device according to Example 3.

FIG. 7 is a cross-sectional view illustrating a configuration of a light-emitting device 10 according to Example 3. The drawing corresponds to FIG. 1 of the embodiment. The light-emitting device 10 according to the present example is configured such that the low refractive index layer 400 is the adhesive layer 210. That is, the light-emitting device is the same as the light-emitting device 10 according to Example 1, except that the adhesive layer 210 also serves as the low refractive index layer 400. Hereinafter, a detailed description will be given.

In the present example, the adhesive layer 210 is formed of a material having a refractive index lower than the refractive index $n_S$ of the substrate 100. In the present example, the low refractive index layer 400 is provided so as to cover the whole of the substrate 100 except the edge of the substrate. In addition, in the example of the drawing, the surface of the low refractive index layer 400 which faces the substrate 100 is in contact with the protective layer 162, and the surface of the low refractive index layer 400 on the opposite side to the substrate 100 is in contact with the cover member 200. Meanwhile, in the drawing, an example is shown in which the protective layer 162 that covers the light-emitting portion 140 is provided, but the protective layer may have a structure in which a plurality of layers are laminated, and may be omitted. In a case where the protective layer 162 is omitted, the surface of the low refractive index layer 400 on the substrate 100 side is provided so as to be in contact with the substrate 100 and the second electrode 130.

In the present example, the low refractive index layer 400 is constituted of an adhesive containing low-refractive-index particles such as, for example, $SiO_x$ or $MgF_2$. As a base adhesive, for example, an epoxy resin can be used, but there is no limitation thereto. In addition, the thickness of the low refractive index layer 400 is, for example, equal to or greater than 1 μm and equal to or less than 500 μm.

Hereinbefore, according to the present example, as is the case with the embodiment, light reflected on the front surface side of the substrate 100 is prevented from being emitted to the rear surface side of the light-emitting device 10, and thus it is possible to reduce the rear-surface leakage light. In addition, according to the present example, the adhesive layer 210 also serves as the low refractive index layer 400. Therefore, it is not necessary to increase the number of steps for manufacturing the low refractive index layer 400.

EXAMPLE 4

A light-emitting device 10 according to Example 4 will be described below. The light-emitting device 10 according to the present example is the same as the light-emitting device 10 according to Example 1, except that the cover member 200 is the low refractive index layer 400, that is, the cover member 200 also serves as the low refractive index layer 400. The light-emitting device 10 according to the present example can be described with the same cross-sectional view as that in FIG. 7. However, the adhesive layer 210 may not be the low refractive index layer 400.

In the present example, the cover member 200 is formed of a material having a refractive index lower than the refractive index $n_S$ of the substrate 100. In the present example, the low refractive index layer 400 is provided so as to cover the whole of the substrate 100 except the edge of the substrate.

In a case where the cover member 200 is fixed to the light-emitting portion 140 through the adhesive layer 210, the low refractive index layer 400 is constituted of, for example, a resin containing low-refractive-index particles such as $SiO_x$, $MgF_2$ or the like, or a fluorine-based resin. A base resin is not particularly limited, and can have PEN, PET or the like used thereas. In addition, the thickness of the low refractive index layer 400 is not particularly limited, and can be set to be, for example, equal to or greater than 10 μm and equal to or less than 1,000 μm. The low refractive index layer 400 is configured such that one surface is in contact with the adhesive layer 210, and that the other surface is exposed to the rear side of the light-emitting device 10. Meanwhile, as described above, a barrier layer or the like may be further provided on at least one surface of the low refractive index layer 400 (cover member 200).

On the other hand, the cover member 200 as the low refractive index layer 400 may be provided over the protective layer 162 constituted of $SiN_x$, SiON, $Al_2O_3$, $TiO_2$ or the like without providing the adhesive layer 210. In this case, the refractive index layer 400 is fixed to the protective layer 162 without going through the adhesive layer 210. The low refractive index layer 400 is constituted of, for example, a resin containing low-refractive-index particles such as $SiO_x$, $MgF_2$ or the like, or a fluorine-based resin. The low refractive index layer 400 also has a function of preventing a barrier property from being damaged due to damage to an inorganic sealing film (protective layer 162). In this case, the thickness of the low refractive index layer 400 is not particularly limited, and is, for example, equal to or greater than 0.1 μm and equal to or less than 100 μm.

Meanwhile, the light-emitting device 10 according to the present example may be provided with the protective layer 162 that covers the light-emitting portion 140 as in Example 1, and the protective layer 162 may be omitted.

Hereinbefore, according to the present example, as is the case with the embodiment, light reflected on the front surface side of the substrate 100 is prevented from being emitted to the rear surface side of the light-emitting device 10, and thus it is possible to reduce the rear-surface leakage light. In addition, according to the present example, the cover member 200 also serves as the low refractive index layer 400. Therefore, it is not necessary to increase the number of steps for manufacturing the low refractive index layer 400.

EXAMPLE 5

Figure 8:
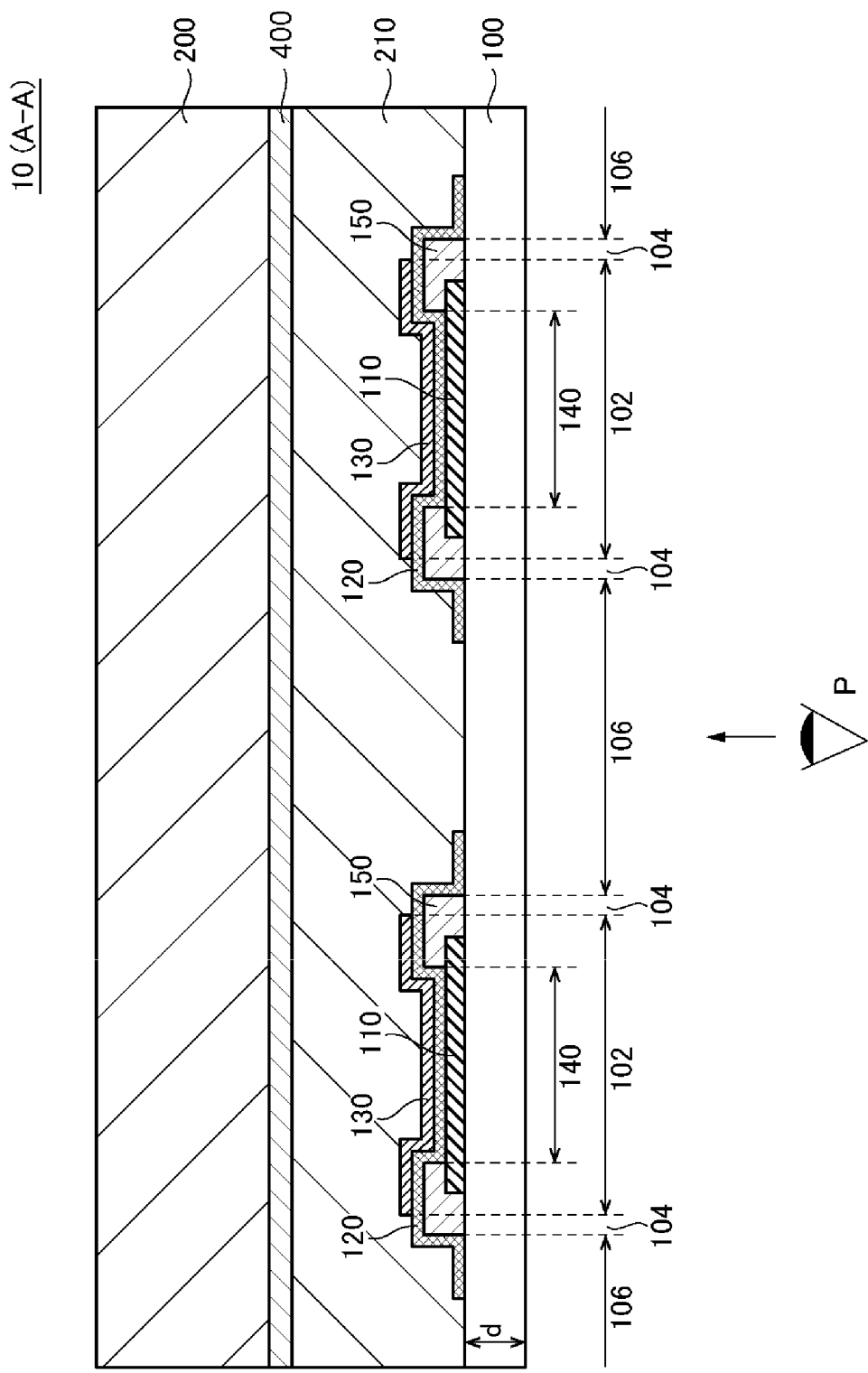
FIG. 8 is a cross-sectional view illustrating a configuration of a light-emitting device according to Example 5.

FIG. 8 is a cross-sectional view illustrating a configuration of a light-emitting device 10 according to Example 5. The drawing corresponds to FIG. 1 of the embodiment. The light-emitting device 10 according to the present example is the same as the light-emitting device 10 according to the embodiment, except for a position at which the low refractive index layer 400 is provided. In FIG. 8, an example is shown in which the low refractive index layer 400 is provided between the adhesive layer 210 and the cover member 200, but the low refractive index layer 400 may be provided on a surface on the opposite side to the cover member 200. Hereinafter, a detailed description will be given.

In the present example, the low refractive index layer 400 having a refractive index lower than the refractive index $n_S$ of the substrate 100 is formed on the cover member 200. The low refractive index layer 400 may or may not have a barrier property against moisture and gas. However, in a case where the low refractive index layer does not have a barrier property, it is preferable that a barrier layer is separately laminated. In the present example, the low refractive index layer 400 is provided so as to cover the whole of the substrate 100 except the edge of the substrate. In addition, in the example of the drawing, the surface of the low refractive index layer 400 which faces the substrate 100 is in contact with the adhesive layer 210, and the surface of the low refractive index layer 400 on the opposite side to the substrate 100 is in contact with the cover member 200. In the present example, the low refractive index layer 400 is constituted of, for example, an inorganic film such as SiOx, MgF$_2$ or the like, a resin containing fine particles such as SiOx, MgF$_2$ or the like, or a fluorine-based resin. In addition, the thickness of the low refractive index layer 400 is, for example, equal to or greater than 10 nm and equal to or less than 100 μm.

A method of manufacturing the light-emitting device 10 according to the present example is the same as a method of manufacturing the light-emitting device 10 according to the embodiment until a step of forming the second electrode 130. In the method of the present example, the low refractive index layer 400 is separately filmed on at least any one surface of the cover member 200 using, for example, a vacuum film formation method such as a sputtering method, a CVD method, an ALD method or the like. The low refractive index layer 400 may also serve as a barrier layer. The cover member 200 is attached by the adhesive layer 210.

Meanwhile, in the present example, as in Example 1, the protective layer 162 may be further provided between the light-emitting portion 140 and the adhesive layer 210.

Hereinbefore, according to the present example, as is the case with the embodiment, light reflected on the front surface side of the substrate 100 is prevented from being emitted to the rear surface side of the light-emitting device 10, and thus it is possible to reduce the rear-surface leakage light. In addition, according to the present example, the low refractive index layer 400 is laminated and provided over the cover member 200. That is, the low refractive index layer 400 is laminated over the cover member 200, and then can be fixed over the light-emitting portion 140. Therefore, the degree of freedom of a material constituting the light-emitting device 10 or a manufacturing process is high.

EXAMPLE 6

Figure 9:
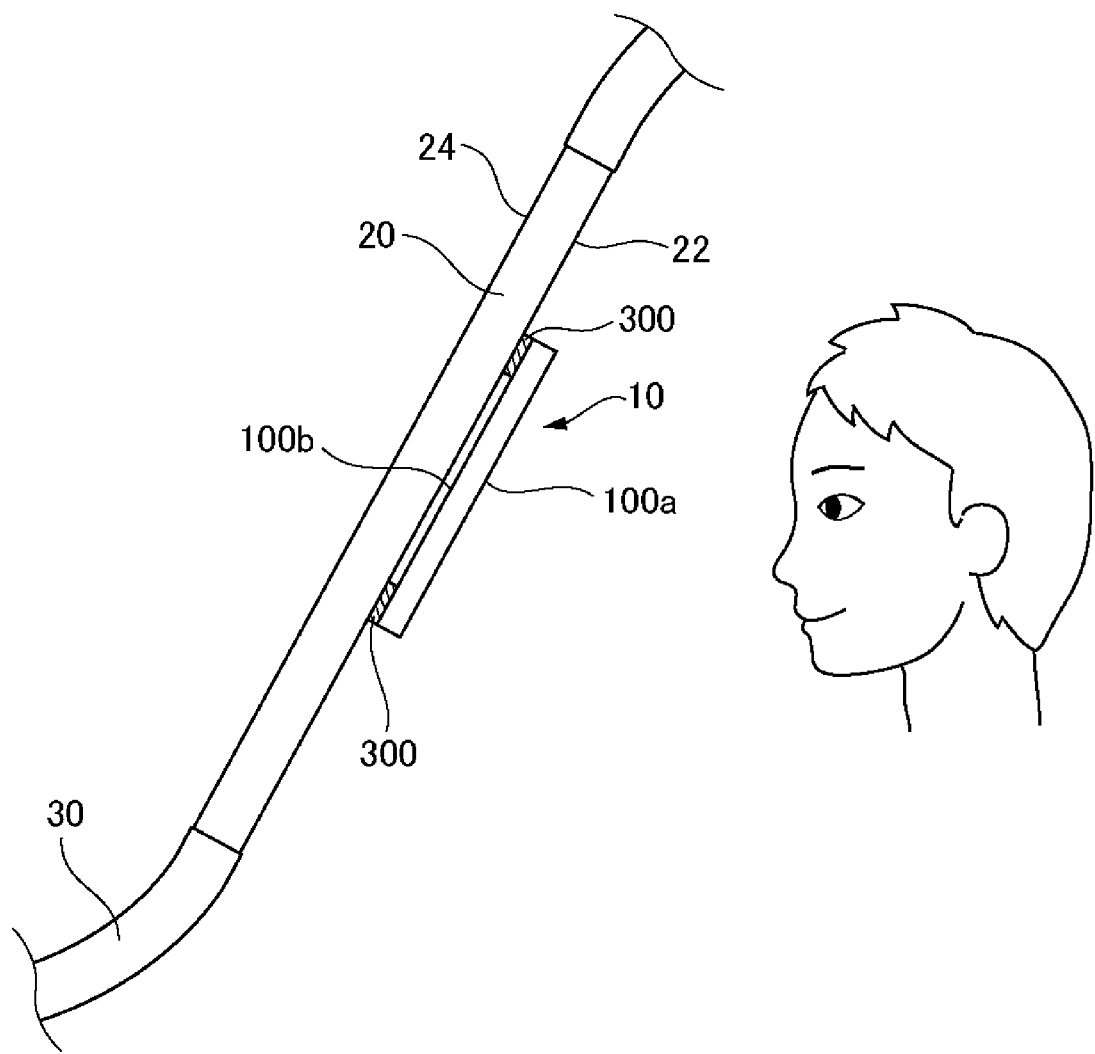
FIG. 9 is a cross-sectional view illustrating a configuration example of a light-emitting system according to Example 6.

FIG. 9 is a cross-sectional view illustrating a configuration example of a light-emitting system according to Example 6. This light-emitting system includes the light-emitting device 10 which are described above and the partition member 20. Specifically, the light-emitting system includes the light-transmitting partition member 20, light-transmitting substrate 100, the plurality of light-emitting portions 140, the light-transmitting region, the cover member 200, and the low refractive index layer 400. The partition member 20 partitions a space from the outside. The substrate 100 is disposed on the partition member 20. The light-emitting portion 140 is formed on the first surface $S_1$ of the substrate 100. In addition, the light-emitting portion 140 includes the light-transmitting first electrode 110, the light-reflective second electrode 130, and the organic layer 120 located between the first electrode 110 and the second electrode 130. The light-transmitting region is located between the plurality of light-emitting portions 140. The cover member 200 covers the light-emitting portions 140. The low refractive index layer 400 is located on the first surface $S_1$ side of the substrate 100, and has a refractive index $n_L$ lower than the refractive index $n_S$ of the substrate 100. Hereinafter, a detailed description will be given.

The partition member 20 has optical transparency, and partitions a space from the outside. This space is, for example, a space in which a person stays, or a space in which things such as commercial products are disposed. The light-emitting device 10 has the same configuration as that in any of the embodiment and Examples 1 to 5 described above. In the example shown in the drawing, a surface (first surface 100a) of the substrate 100 on which the light-emitting portion 140 is provided is directed toward a space in which a person stays.

The partition member 20 is, for example, a window of a moving object 30 for a person to move, or a window of a showcase, and is formed using glass or a light-transmitting resin. The moving object 30 is, for example, an automobile, a train, or an airplane. In a case where the moving object 30 is an automobile, the partition member 20 is a windshield, a rear glass, or a window glass (for example, door glass) installed on the side of the seat. In a case where the partition member 20 is a rear glass, a plurality of light-emitting portions 140 function as, for example, a brake lamp. In addition, in a case where the partition member 20 is a windshield or a rear glass, the plurality of light-emitting portions 140 may be a turn lamp. In addition, the partition member 20 may be a window for partitioning the inside and outside of a room such as a meeting room. The present light-emitting system may be a light-emitting system capable of identifying whether to use a meeting room, depending on the lighting/non-lighting of the light-emitting portion 140.

A second surface 100b of the light-emitting device 10 is fixed to an inner surface (first surface 22) of the partition member 20 with an adhesive layer 300 interposed therebetween. Here, the second surface 100b is a surface on the opposite side to the first surface 100a, and is a surface on the light extraction side. Therefore, light which is radiated from the light-emitting portion 140 of the light-emitting device 10 is radiated to the outside of the aforementioned space (for example, moving object 30) through the partition member 20. On the other hand, the light-emitting device 10 has optical transparency. Therefore, a person can visually recognize the outside or inside of the space through the partition member 20. For example, a person who is located inside the moving object 30 can visually recognize the outside of the moving object 30 through the partition member 20.

The adhesive layer 300 fixes the light-emitting device 10 to the partition member 20. Insofar as a material fulfilling such a function is used, there is no particular limitation on the material of the adhesive layer 300. In the present example, some (for example, two sides facing each other) of the second surface 100b of the substrate 100 are fixed to the first surface 22 of the partition member 20 with the adhesive layer 300 interposed therebetween. Therefore, an air gap is formed between the substrate 100 and the first surface 22. Even in such a case, the light-emitting device 10 includes the low refractive index layer 400, and thus it is possible to reduce the rear-surface leakage light.

Figure 10:
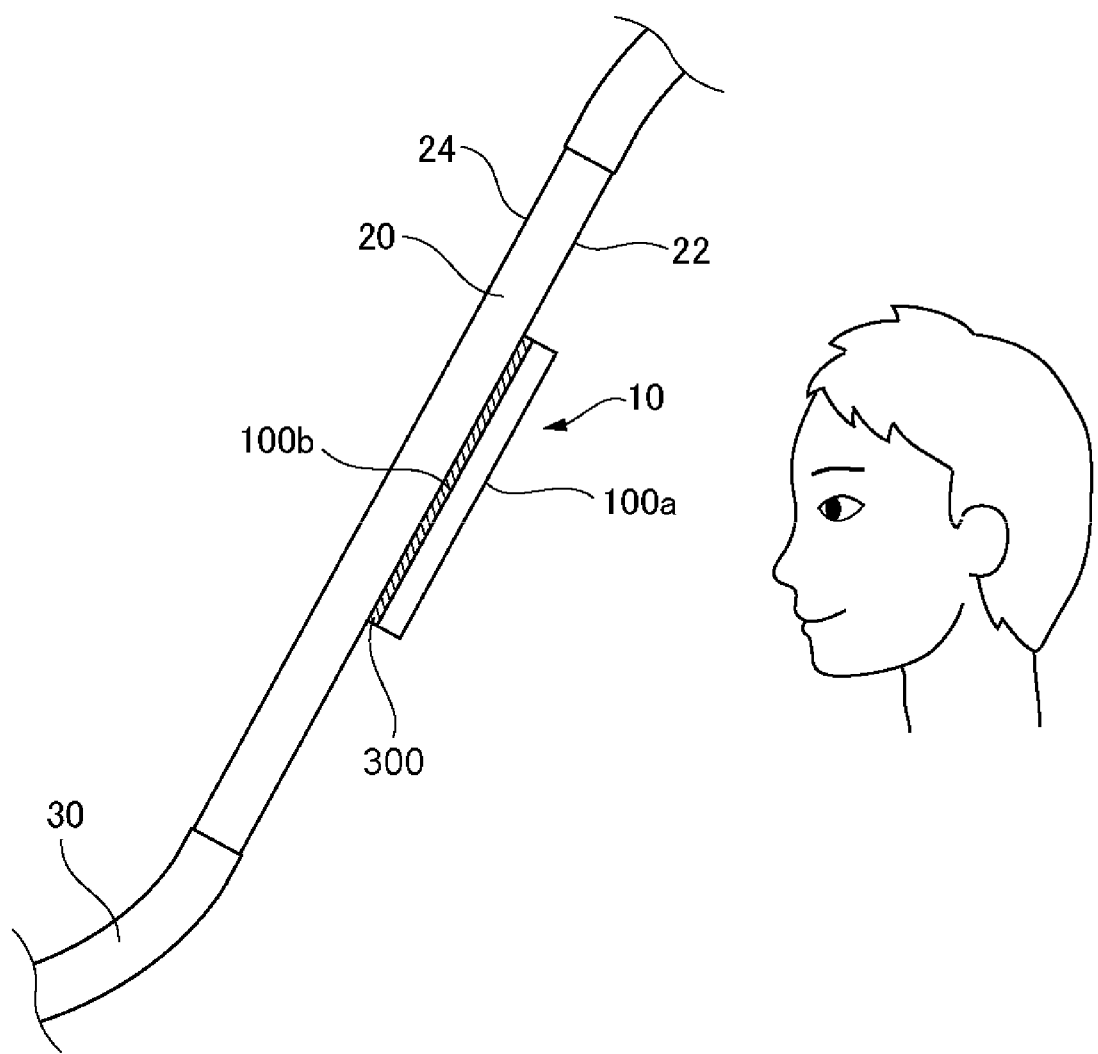
FIG. 10 is a cross-sectional view illustrating another configuration example of the light-emitting system according to Example 6.

FIG. 10 is a cross-sectional view illustrating another configuration example of the light-emitting system according to Example 6. As shown in the drawing, the entirety of the second surface 100b of the substrate 100 may be fixed to the first surface 22 of the partition member 20 with the adhesive layer 300 interposed therebetween. Here, in a case where the refractive index of the partition member 20 and the refractive index of the substrate 100 of the light-emitting device 10 are substantially the same as each other such as, for example, a case where both the partition member 20 and the substrate 100 are formed of glass, a material having a refractive index same as or close to those of the both is used in the adhesive layer 300. In addition, in a case where the partition member 20 and the substrate 100 are different from each other in refractive index (for example, the partition member 20 is formed of plastic, and the substrate 100 is formed of glass), it is preferable that the refractive index of the adhesive layer 300 is a numerical number between the refractive index of the partition member 20 and the refractive index of the substrate 100. With such a configuration, light emitted from the light-emitting device 10 can be efficiently extracted to the outside through the partition member 20. In the example of the drawing, as is the case with the embodiment, the light-emitting device 10 includes the low refractive index layer 400, and thus it is possible to reduce the rear-surface leakage light.

EXAMPLE 7

Figure 11:
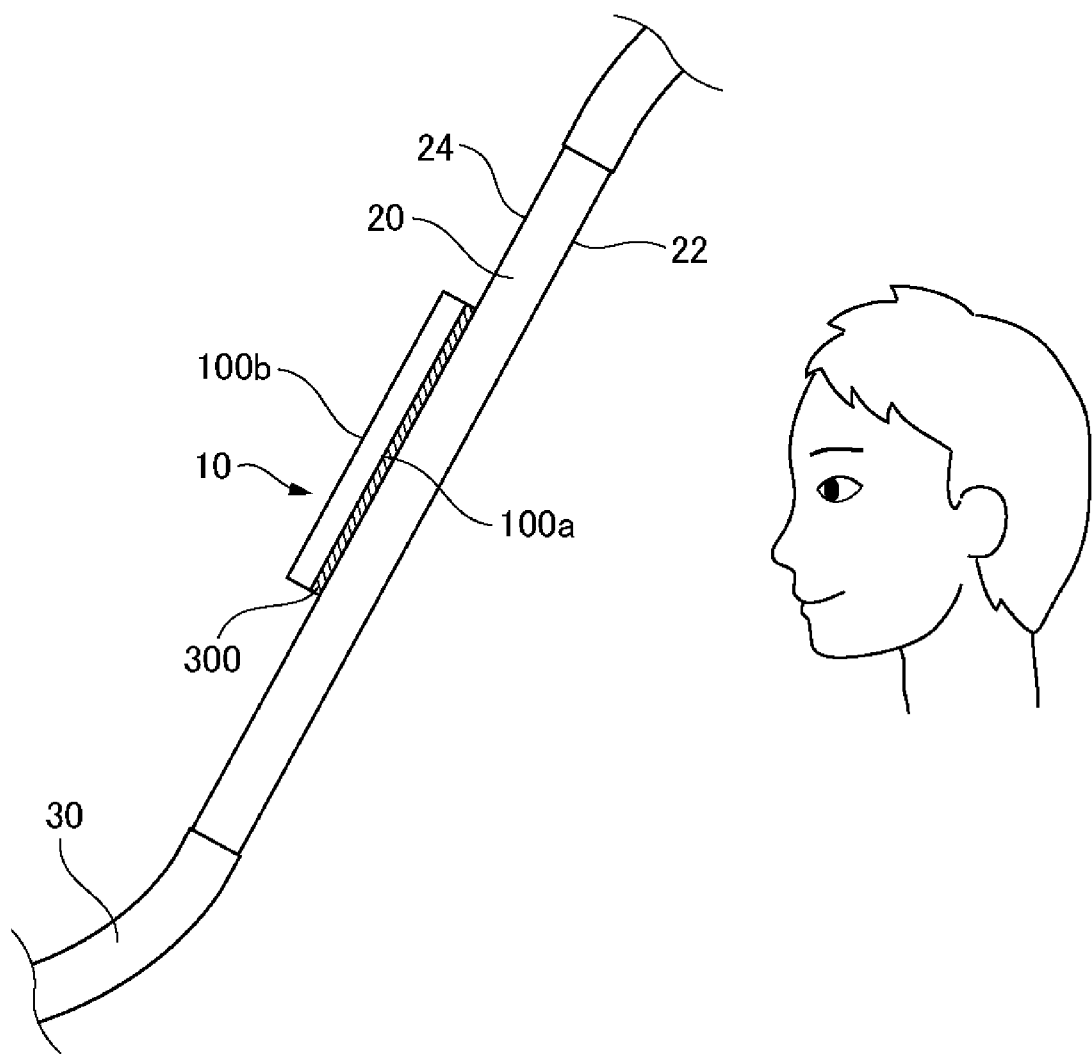
FIG. 11 is a cross-sectional view illustrating a configuration example of a light-emitting system according to Example 7.

FIG. 11 is a cross-sectional view illustrating a configuration of a light-emitting system according to Example 7. The light-emitting system according to the present example has the same configuration as that of the light-emitting system according to Example 6, except that the light-emitting device 10 is installed on a surface (second surface 24) of the partition member 20 which is located outside of the moving object 30.

The light-emitting device 10 according to the present example has the same configuration as that in any of the embodiment and Examples 1 to 5 described above. However, the light-emitting device 10 is configured such that a surface on the opposite side to the partition member 20 serves as a light extraction surface. For this, the surface of the light-emitting device 10 on the first surface 100a side may be caused to face the partition member 20.

Likewise, in the present example, the light-emitting device 10 includes the low refractive index layer 400, and thus it is possible to reduce the rear-surface leakage light.

In addition, light from the light-emitting device 10 is radiated directly to the outside of the moving object 30 without going through the partition member 20. Therefore, there is more of a tendency for a person who is located outside of the moving object 30 to recognize the light from the light-emitting device 10 than in Example 6. In addition, since the light-emitting device 10 is installed on the outside of the moving object 30, that is, the second surface 24 side of the partition member 20, it is possible to prevent the light from the light-emitting device 10 from being reflected by the partition member 20 and entering the inside of the moving object 30.

EXAMPLE 8

Figure 12:
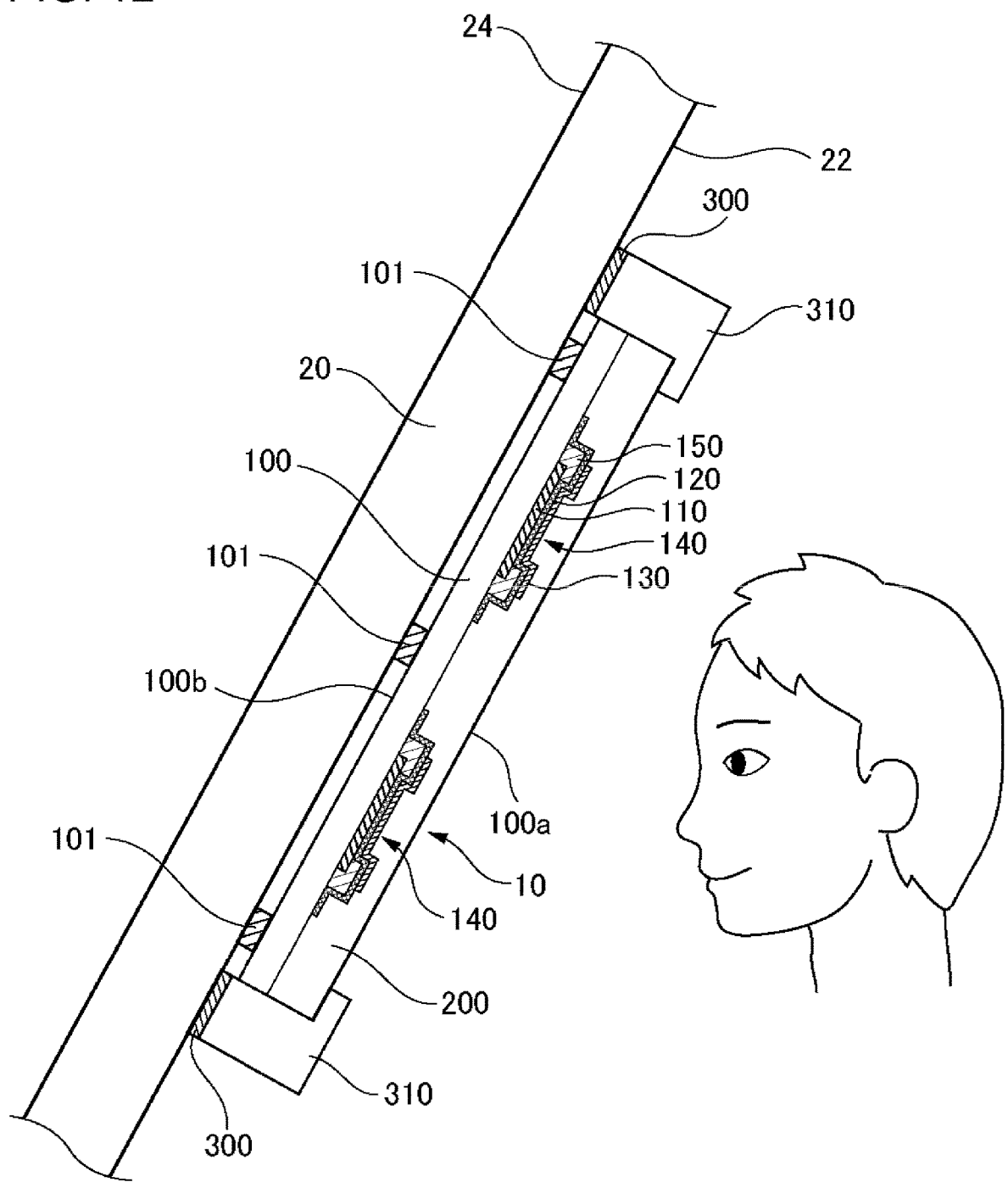
FIG. 12 is a cross-sectional view illustrating a configuration example of a light-emitting system according to Example 8.

FIG. 12 is a cross-sectional view illustrating a configuration example of a light-emitting system according to Example 8. The light-emitting system according to the present example has the same configuration as that of the light-emitting system according to Example 6, except that the light-emitting device 10 is fixed to the partition member 20 using a fixing member 310.

The fixing member 310 is a frame-like member, and has the lower surface thereof fixed to the partition member 20 using the adhesive layer 300. The upper portion of the fixing member 310 is bent toward the inside of the fixing member 310, and presses down the edge of the light-emitting device 10 at this bent portion. However, the shape of the fixing member 310 is not limited to the example shown in the drawing.

In the present example, the second surface 100b of the light-emitting device 10 is provided with a convex portion 101 so as to surround the light-emitting portion 140 when seen from a direction perpendicular to the substrate 100. Therefore, in a region overlapping 140 when seen from the direction perpendicular to the substrate, an air gap is formed between the substrate 100 and the first surface 22. The convex portion 101 is formed of, for example, a resin material. However, the light-emitting device 10 may not be provided with the convex portion 101, and thus the air gap may not be formed. Even in such a case, the light-emitting device 10 includes the low refractive index layer 400, and thus it is possible to reduce the rear-surface leakage light.

Figure 13:
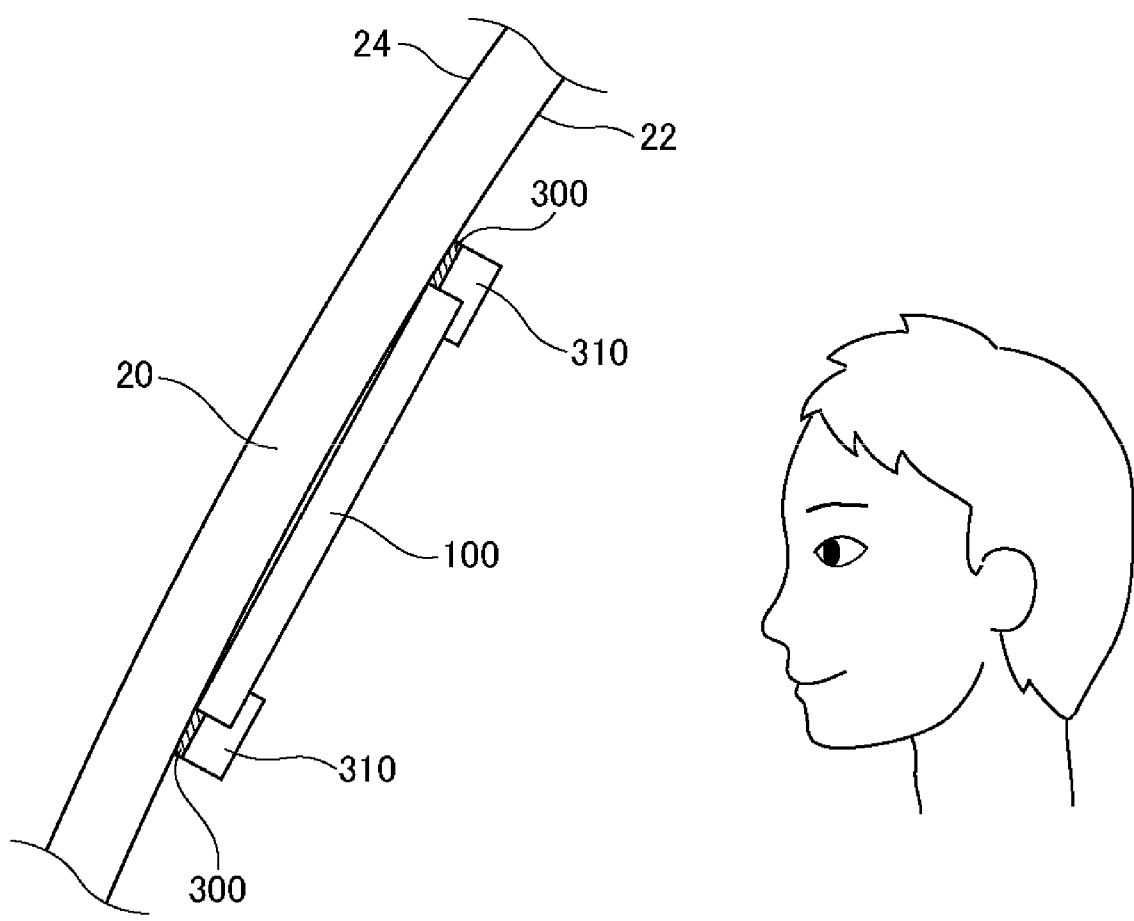
FIG. 13 is a cross-sectional view illustrating another configuration example of the light-emitting system according to Example 8.

FIG. 13 is a cross-sectional view illustrating another configuration example of the light-emitting system according to Example 8. As shown in the drawing, the partition member 20 may be bent in the direction of protruding toward the outer side of the moving object 30. In such a case, it is difficult to fix the flat plate-shaped light-emitting device 10 directly to the inner surface (first surface 22) of the partition member 20. However, in a case where the fixing member 310 is used, the light-emitting device 10 can be fixed to the first surface 22 of the partition member 20 even in such a case. Meanwhile, the substrate 100 may or may not be provided with the convex portion 101 shown in FIG. 12.

Likewise, in the present example, the light-emitting device 10 includes the low refractive index layer 400, and thus it is possible to reduce the rear-surface leakage light.

EXAMPLE 9

Figure 14:
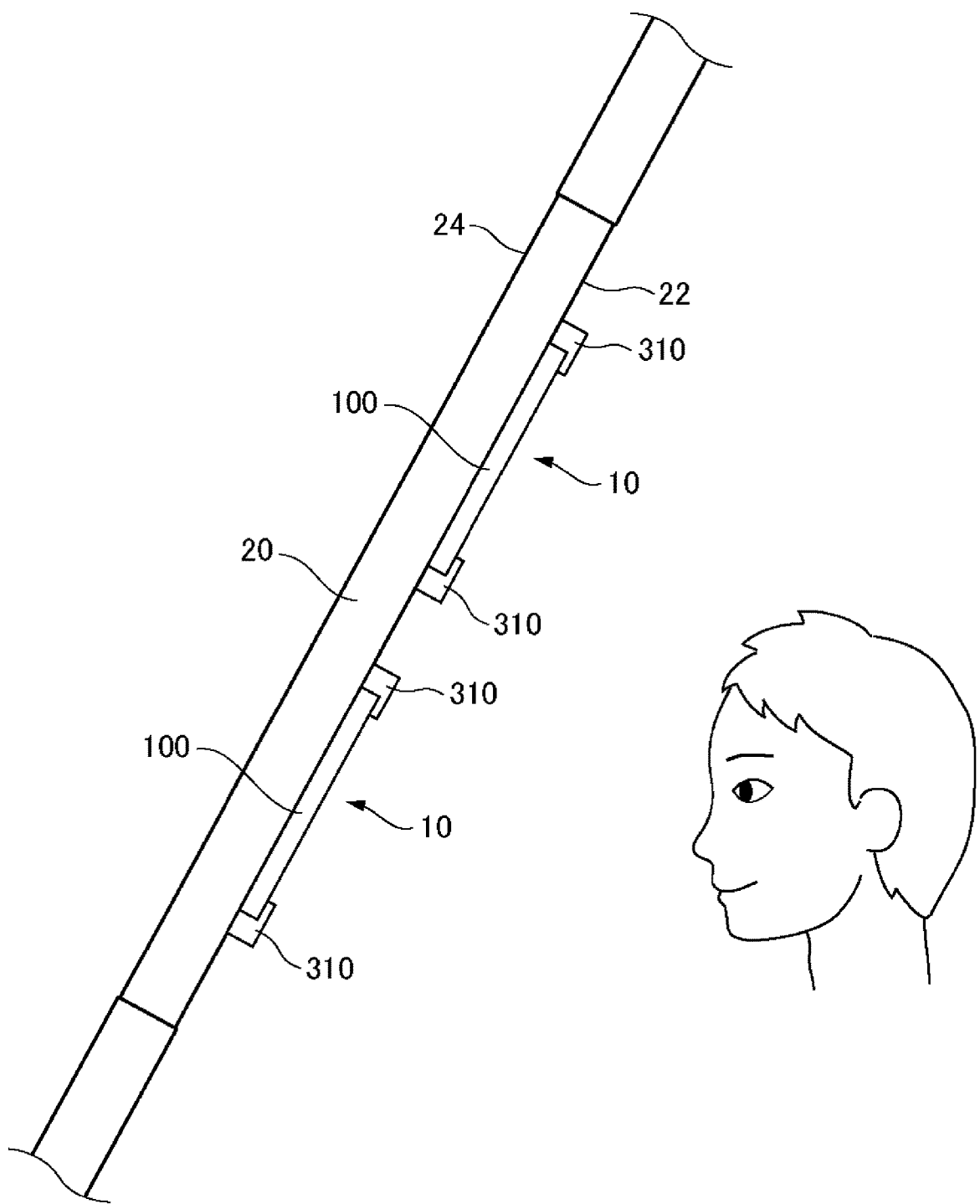
FIG. 14 is a cross-sectional view illustrating a configuration example of a light-emitting system according to Example 9.

FIG. 14 is a cross-sectional view illustrating a configuration example of a light-emitting system according to Example 9. The light-emitting system according to the present example has the same configuration as that of any of Examples 6 to 8 described above, except that a plurality of light-emitting devices 10 are installed on the partition member 20. Meanwhile, in FIG. 14, an example corresponding to FIG. 12 is shown in a simplified form. In the plurality of light-emitting devices 10, lighting and extinction may be controlled in accordance with control signals equal to each other, and lighting and extinction may be controlled in accordance with control signals different from each other.

Likewise, in the present example, the light-emitting device 10 includes the low refractive index layer 400, and thus it is possible to reduce the rear-surface leakage light.

EXAMPLE 10

Figure 15:
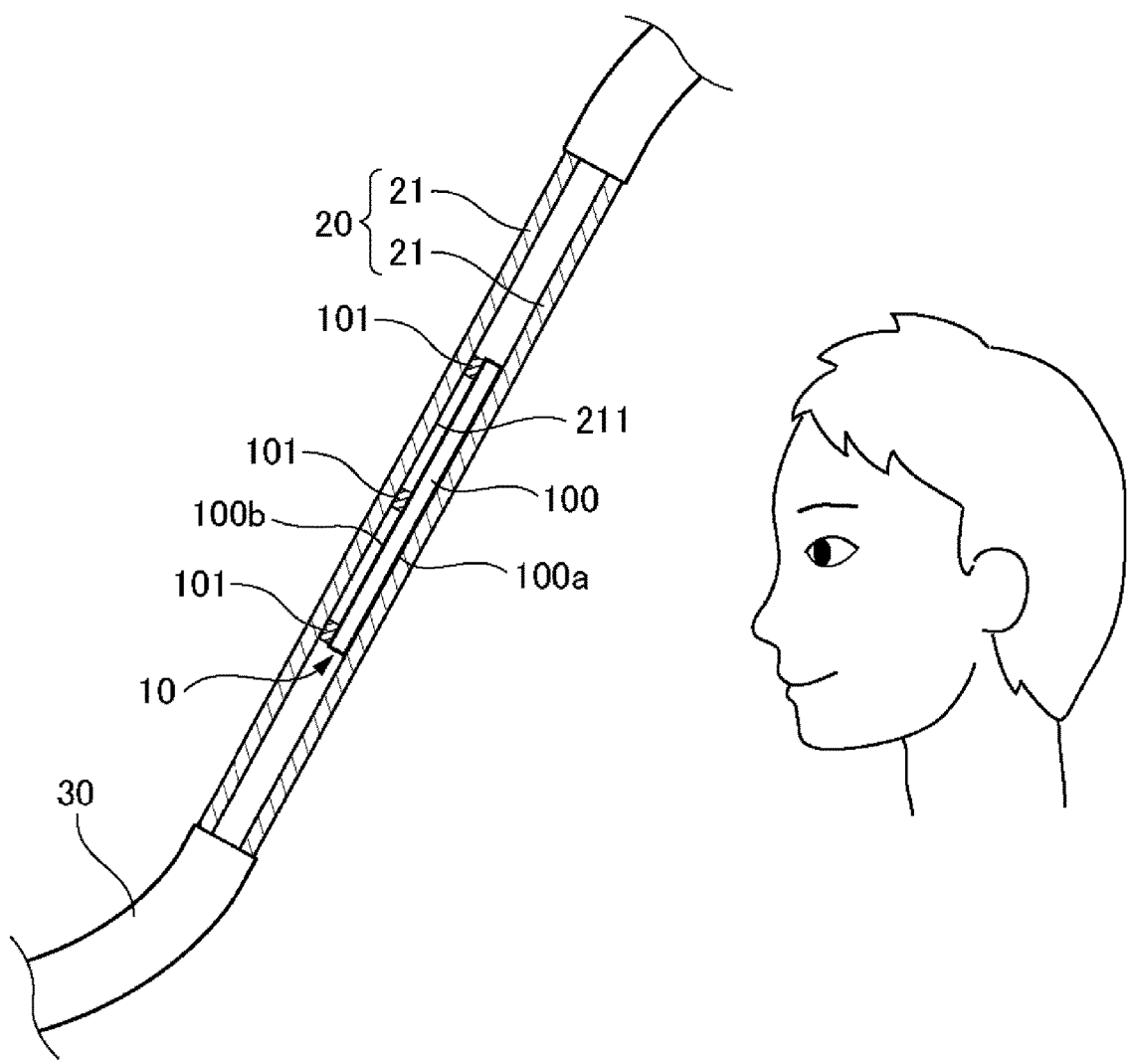
FIG. 15 is a cross-sectional view illustrating a configuration example of a light-emitting system according to Example 10.

FIG. 15 is a cross-sectional view illustrating a configuration example of a light-emitting system according to Example 10. The light-emitting system according to the present example has the same configuration as that of the light-emitting system according to Example 6, except for the configuration of the partition member 20 and the position of the light-emitting device 10.

In the present example, the partition member 20 has a configuration in which a plurality of light-transmitting members 21 (for example, glass plates or resin plates) overlap each other. The light-emitting device 10 is interposed between the light-transmitting members 21 next to each other and thus is installed on the partition member 20.

In the present example, the second surface 100b of the light-emitting device 10 is provided with the convex portion 101 so as to surround the light-emitting portion 140 when seen from a direction perpendicular to the substrate 100. Therefore, in a region overlapping the light-emitting portion 140 when seen from the direction perpendicular to the substrate, an air gap is formed between the substrate 100 and a surface 211 of the light-transmitting member 21 which faces the substrate 100. However, the light-emitting device 10 is not provided with the convex portion 101, and thus the air gap may not be formed.

Likewise, in the present example, the light-emitting device 10 includes the low refractive index layer 400, and thus it is possible to reduce the rear-surface leakage light.

As described above, although the embodiment and examples of the present invention have been set forth with reference to the accompanying drawings, they are merely illustrative of the present invention, and various configurations other than those stated above can be adopted.

The invention claimed is:

1. A light-emitting device comprising:
a light-transmitting substrate;
a plurality of light-emitting portions, formed on a first surface of the substrate, which include a light-transmitting first electrode, a light-reflective second electrode, and an organic layer located between the first electrode and the second electrode;
a light-transmitting region located between the plurality of light-emitting portions;
a cover member that covers the light-emitting portions; and
a low refractive index layer, located on the first surface side of the substrate, which has a refractive index $n_L$ lower than a refractive index $n_S$ of the substrate.

2. The light-emitting device according to claim 1, wherein when $\theta_{c1}=\arcsin(1/n_S)$, a relation of $n_L < n_S \times \sin(3\theta_{c1}/10 + 7\pi/20)$ is established.

3. The light-emitting device according to claim 2, wherein a relation of $n_L < n_S \times \sin(\theta_{c1}/2 + \pi/4)$ is established.

4. The light-emitting device according to claim 3, wherein a relation of $n_L < n_S \times \sin(7\theta_{c1}/10 + 3\pi/20)$ is established.

5. The light-emitting device according to claim 1, wherein the plurality of light-emitting portions are separated from each other, and each extend in the same direction when seen from a direction perpendicular to the substrate.

6. The light-emitting device according to claim 1, wherein the low refractive index layer is provided so as to cover at least the light-transmitting region when seen from in a direction perpendicular to a surface of the substrate.

7. The light-emitting device according to claim 6, wherein the low refractive index layer is provided so as to cover the whole of the substrate except an edge of the substrate when seen from in the direction perpendicular to the surface of the substrate.

8. The light-emitting device according to claim 1, wherein the low refractive index layer is provided so as to cover an edge of the first electrode.

9. The light-emitting device according to claim 1, wherein the cover member is the low refractive index layer.

10. The light-emitting device according to claim 1, wherein the low refractive index layer is located between the light-emitting portion and the cover member.

11. The light-emitting device according to claim 10, wherein the low refractive index layer is an adhesive layer.

12. The light-emitting device according to claim 10, wherein a thickness of the low refractive index layer is equal to or greater than 1 μm and equal to or less than 500 μm.

13. A light-emitting system comprising:
a light-transmitting partition member that partitions a space from an outside;
a light-transmitting substrate disposed on the partition member;
a plurality of light-emitting portions, formed on a first surface of the substrate, which include a light-transmitting first electrode, a light-reflective second electrode, and an organic layer located between the first electrode and the second electrode;
a light-transmitting region located between the plurality of light-emitting portions;
a cover member that covers the light-emitting portions; and
a low refractive index layer, located on the first surface side of the substrate, which has a refractive index $n_L$ lower than a refractive index $n_S$ of the substrate.

* * * * *